US011277914B2

(12) United States Patent
Nakase et al.

(10) Patent No.: US 11,277,914 B2
(45) Date of Patent: Mar. 15, 2022

(54) PRINTED CIRCUIT BOARD ASSEMBLY

(71) Applicant: Mitsubishi Electric Corporation, Tokyo (JP)

(72) Inventors: Shusaku Nakase, Tokyo (JP); Yusuke Morimoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/642,413

(22) PCT Filed: Nov. 2, 2017

(86) PCT No.: PCT/JP2017/039728
§ 371 (c)(1),
(2) Date: Feb. 27, 2020

(87) PCT Pub. No.: WO2019/087352
PCT Pub. Date: May 9, 2019

(65) Prior Publication Data
US 2020/0260583 A1    Aug. 13, 2020

(51) Int. Cl.
*H05K 1/14*  (2006.01)
*H05K 1/11*  (2006.01)

(52) U.S. Cl.
CPC ............ *H05K 1/141* (2013.01); *H05K 1/117* (2013.01); *H05K 1/14* (2013.01); *H05K 1/142* (2013.01);
(Continued)

(58) Field of Classification Search
CPC combination set(s) only.
See application file for complete search history.

(56) References Cited

U.S. PATENT DOCUMENTS 2,894,241 A * 7/1959 Mckee ................... H05K 3/366
439/65
3,624,587 A * 11/1971 Conrad ................. H01R 12/718
439/65
(Continued)

FOREIGN PATENT DOCUMENTS

JP    S57-071372 U    4/1982
JP    S5974759    *   8/1984    ............... H05K 1/14
(Continued)

OTHER PUBLICATIONS

International Search Report of the International Searching Authority dated Jan. 23, 2018 in corresponding International Patent Application No. PCT/JP2017/039728 (and English translation).

*Primary Examiner* — Paresh H Paghadal
(74) *Attorney, Agent, or Firm* — Posz Law Group, PLC

(57) ABSTRACT

A printed circuit board assembly includes a first printed circuit board with first surface and second surface with a slit portion and a second printed circuit board with third surface and fourth surface with a first end portion and a second end portion. The first end portion is fitted in the slit portion and a tip of the first end portion protrudes from the second surface. The first printed circuit board includes first electrodes arranged along the slit portion in a longitudinal direction of the slit portion on the second surface. The second printed circuit board includes second electrodes arranged in the first end portion on the third and fourth surfaces. The second electrodes are joined to the first electrodes with solder. The first printed circuit board includes a support fixed to the first surface. The second printed circuit board is attached to the support by an adhesive substance.

12 Claims, 15 Drawing Sheets

(52) U.S. Cl.
CPC ....... *H05K 1/145* (2013.01); *H05K 2201/048* (2013.01); *H05K 2201/2045* (2013.01)

(56) References Cited

U.S. PATENT DOCUMENTS

| | | | | |
|---|---|---|---|---|
| 5,455,742 | A | * | 10/1995 | Phoy ................ H05K 3/366 174/250 |
| 5,754,411 | A | * | 5/1998 | Woychik ............ H05K 3/366 361/784 |
| 6,336,815 | B1 | * | 1/2002 | Bestul ................ H01R 12/52 439/66 |
| 11,038,313 | B1 | * | 6/2021 | Reynov ............ H01R 43/205 |
| 2006/0220636 | A1 | * | 10/2006 | Satoh ................ H05K 1/141 310/321 |
| 2007/0096995 | A1 | * | 5/2007 | Lee ..................... H01Q 9/40 343/702 |
| 2013/0078825 | A1 | * | 3/2013 | Wain ................. H05K 3/366 439/64 |
| 2017/0194731 | A1 | * | 7/2017 | Van Rijswijk ...... H05K 3/366 |

FOREIGN PATENT DOCUMENTS

| | | |
|---|---|---|
| JP | 2008-171849 A | 7/2008 |
| JP | 4314809 B | 8/2009 |
| WO | 2017/002720 A1 | 1/2017 |

\* cited by examiner (a)

(b)

(a)

(b)

PRINTED CIRCUIT BOARD ASSEMBLY

CROSS REFERENCE TO RELATED APPLICATION

This application is a U.S. national stage application of PCT/JP2017/039728 filed on Nov. 2, 2017, the contents of which are incorporated herein by reference.

TECHNICAL FIELD

The present disclosure relates to a printed circuit board assembly that includes a first printed circuit board including a slit portion and a second printed circuit board fitted in the slit portion and in which a plurality of first electrodes of the first printed circuit board are soldered to a plurality of second electrodes of the second printed circuit board.

BACKGROUND ART

Some printed circuit board assemblies each assembled from a first printed circuit board and a second printed circuit board have been developed in the related art (refer to, for example, Patent Literature 1). Specifically, the first printed circuit board has a first surface and a second surface that is opposite the first surface. The first printed circuit board includes a slit portion extending through the first printed circuit board from the first surface to the second surface. The first printed circuit board includes a plurality of first electrodes arranged along the slit portion in a longitudinal direction of the slit portion on the second surface. More specifically, in Patent Literature 1, the first electrodes arranged along the slit portion in the longitudinal direction are located along opposite sides of the slit portion in a lateral direction of the slit portion.

The second printed circuit board has a third surface, a fourth surface that is opposite the third surface, a first end portion, and a second end portion that is opposite the first end portion. The second printed circuit board includes a plurality of second electrodes, which are to be soldered to the first electrodes of the first printed circuit board, arranged on the third and fourth surfaces.

The first end portion of the second printed circuit board is inserted into the slit portion of the first printed circuit board, and the second electrodes of the second printed circuit board are soldered to the first electrodes of the first printed circuit board, so that the printed circuit board assembly is completed. In this case, a tip of the first end portion of the second printed circuit board protrudes from the second surface of the first printed circuit board. Solder fillets are formed at solder joints between the first and second electrodes. An electronic component mounted on the second printed circuit board is disposed on at least one of the third surface and the fourth surface of the second printed circuit board and is located between the first surface of the first printed circuit board and a tip of the second end portion of the second printed circuit board.

Assembling the first and second printed circuit boards into the printed circuit board assembly in the above-described manner allows a reduction in size of the printed circuit boards.

CITATION LIST

Patent Literature

Patent Literature 1: Japanese Patent No. 4314809

SUMMARY OF INVENTION

Technical Problem

The printed circuit board assembly is incorporated as part of, for example, a controller, in an apparatus. In this case, the first printed circuit board of the printed circuit board assembly is secured to a mounting component included in the apparatus. The mounting component is, for example, a control box made of a metal sheet. While the apparatus is being transported or being operated, the apparatus vibrates. Consequently, vibration of the apparatus is transmitted to the printed circuit board assembly secured to the mounting component of the apparatus. As the vibration is transmitted to the printed circuit board assembly, stress is repeatedly applied to the solder joints between the first electrodes of the first printed circuit board and the second electrodes of the second printed circuit board. The repeatedly applied stress may lead to fatigue fracture of the solder joints.

The present disclosure has been made to solve the above-described problem and aims to provide a printed circuit board assembly in which the likelihood of fatigue fracture of solder joints between first electrodes of a first printed circuit board and second electrodes of a second printed circuit board is reduced.

Solution to Problem

A printed circuit board assembly according to an embodiment of the present disclosure includes a first printed circuit board having a first surface and a second surface that is opposite the first surface and including a slit portion extending through the first printed circuit board from the first surface to the second surface and a second printed circuit board having a third surface and a fourth surface that is opposite the third surface and including a first end portion and a second end portion that is opposite the first end portion. The first end portion is fitted in the slit portion in such a manner that a tip of the first end portion protrudes from the second surface. The first printed circuit board includes a plurality of first electrodes arranged along the slit portion in a longitudinal direction of the slit portion on at least one of the first surface and the second surface. The second printed circuit board includes a plurality of second electrodes arranged in the first end portion on at least one of the third surface and the fourth surface. The plurality of second electrodes are joined to the plurality of first electrodes with solder. The first printed circuit board further includes a support fixed to the first surface. The second printed circuit board is attached to the support by an adhesive substance.

Advantageous Effects of Invention

In the printed circuit board assembly according to an embodiment of the present disclosure, the first printed circuit board is fixed to the second printed circuit board by the support. Such a configuration of the printed circuit board assembly according to an embodiment of the present disclosure allows stress that is applied to solder joints between the first electrodes of the first printed circuit board and the second electrodes of the second printed circuit board to be smaller than stress in the related art. Consequently, the likelihood of fatigue fracture of the solder joints between the first electrodes of the first printed circuit board and the second electrodes of the second printed circuit board in the printed circuit board assembly according to an embodiment of the present disclosure is lower than the likelihood of fatigue fracture of the solder joints in the related art.

DESCRIPTION OF EMBODIMENTS

Figure 1:
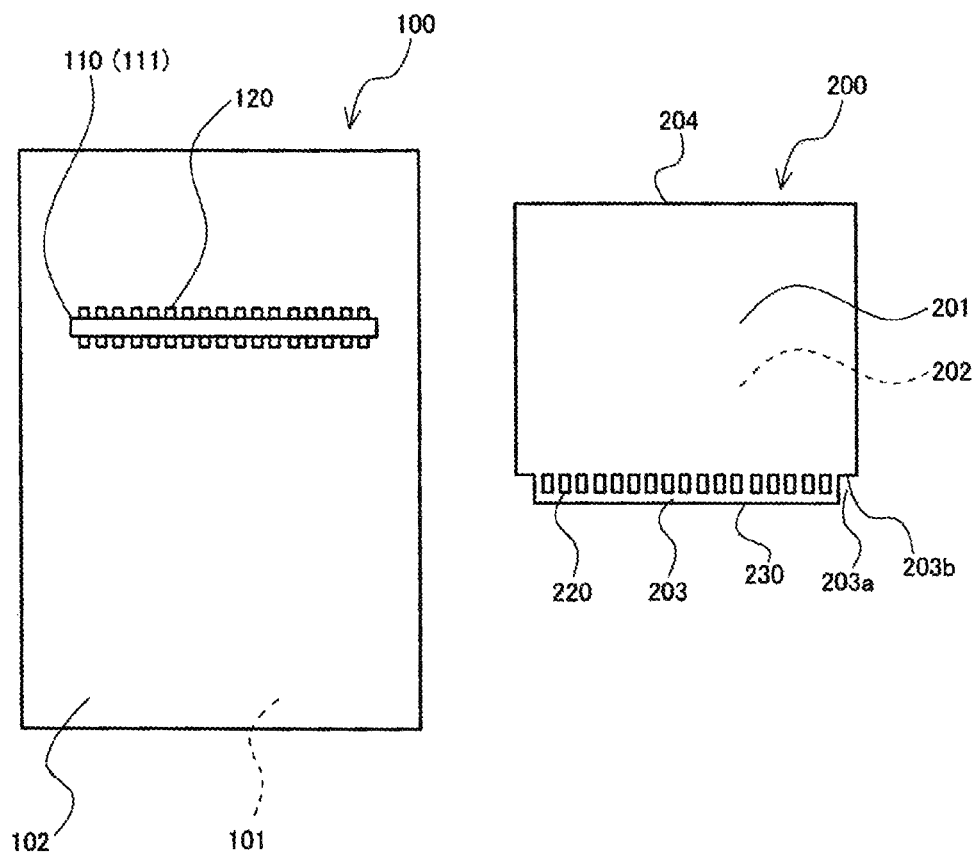
FIG. 1 is a diagram illustrating a first printed circuit board and a second printed circuit board included in a related art printed circuit board assembly.

A printed circuit board assembly according to the present disclosure includes a first printed circuit board and a second printed circuit board fixed to each other by a support. Such a configuration alleviates stress that is applied to solder joints between first electrodes of the first printed circuit board and second electrodes of the second printed circuit board. Exemplary printed circuit board assemblies according to embodiments of the present disclosure will be described below. In Embodiment 1, a related art printed circuit board assembly including a first printed circuit board and a second printed circuit board that are not fixed to each other by a support will be described for the sake of easy understanding of advantageous effects of the printed circuit board assembly according to the present disclosure, and the printed circuit board assembly according to the present disclosure will then be described. In the drawings of the following embodiments, a dashed leader line is for a component hidden by another component.

Embodiment 1

Figure 2:
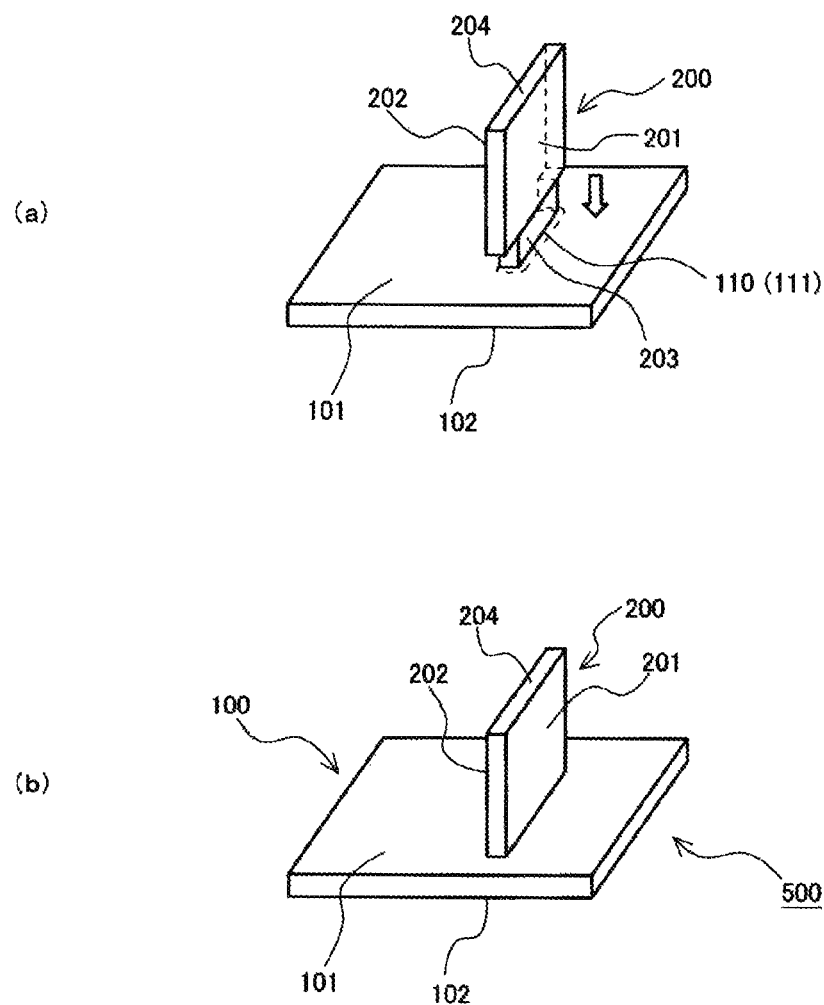
FIG. 2 includes perspective views of the related art printed circuit board assembly.
Figure 3:
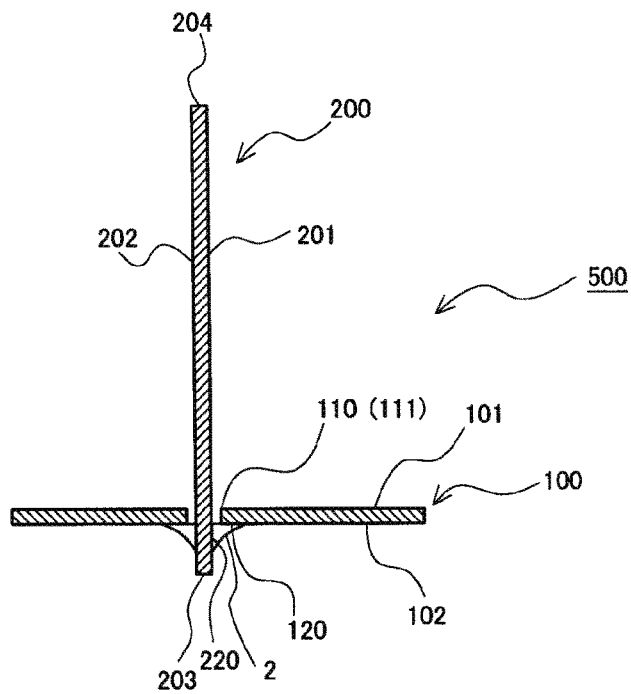
FIG. 3 is a cross-sectional view of the related art printed circuit board assembly.

FIG. 1 is a diagram illustrating the first printed circuit board and the second printed circuit board included in the related art printed circuit board assembly. FIG. 2 includes perspective views of the related art printed circuit board assembly. FIG. 3 is a cross-sectional view of the related art printed circuit board assembly. FIG. 2(a) is an exploded perspective view of a related art printed circuit board assembly 500. FIG. 2(b) is an assembled perspective view of the related art printed circuit board assembly 500. FIG. 3 illustrates a cross-section of the related art printed circuit board assembly 500 taken in a direction orthogonal to a longitudinal direction of a slit portion 110 included in a first printed circuit board 100.

The printed circuit board assembly 500 includes the first printed circuit board 100 and a second printed circuit board 200. The first printed circuit board 100 has a surface 101 and a surface 102 that is opposite the surface 101. The first printed circuit board 100 includes the slit portion 110 extending through the first printed circuit board 100 from the surface 101 to the surface 102. The slit portion 110 includes at least one slit. Specifically, the slit portion 110 receives a protrusion included in an end portion 203 of the second printed circuit board 200 as will be described later. The number of slits included in the slit portion 110 is therefore equal to the number of protrusions included in the end portion 203 of the second printed circuit board 200. As will be described later, the end portion 203 of the second printed circuit board 200 in the printed circuit board assembly 500 has one protrusion 230. The slit portion 110 of the first printed circuit board 100 in the printed circuit board assembly 500 therefore has one slit 111.

The first printed circuit board 100 includes a plurality of first electrodes 120 arranged along the slit portion 110 in the longitudinal direction of the slit portion 110 on the surface 102. More specifically, the first electrodes 120 arranged along the slit portion 110 in the longitudinal direction of the slit portion 110 are arranged along opposite sides of the slit portion 110 in a lateral direction of the slit portion 110 in the printed circuit board assembly 500. The first electrodes 120 may be arranged on the surface 101. The first electrodes 120 may be arranged on both the surface 101 and the surface 102.

The second printed circuit board 200 has a surface 201 and a surface 202 that is opposite the surface 201. The second printed circuit board 200 includes the end portion 203 to be inserted into the slit portion 110 and an end portion 204 that is opposite the end portion 203. Specifically, opposite ends of the end portion 203 are cut away. In other words, the end portion 203 has a notch 203a at each of the opposite ends. Thus, the end portion 203 has one protrusion 230. The protrusion 230 of the end portion 203 is to be inserted into the slit portion 110 of the first printed circuit board 100. When the protrusion 230 is inserted into the slit portion 110, an end face 203b of each notch 203a comes into contact with the surface 101 of the first printed circuit board 100.

The second printed circuit board 200 includes a plurality of second electrodes 220, which are to be soldered to the first electrodes 120 of the first printed circuit board 100, arranged on at least one of the surface 201 and the surface 202. Specifically, the second electrodes 220 are arranged on a surface that is at least one of the surface 201 and the surface 202 and that faces the first electrodes 120 of the first printed circuit board 100. As described above, the first electrodes 120 are arranged along the slit portion 110 in the longitudinal direction of the slit portion 110 and along the opposite sides of the slit portion 110 in the lateral direction of the slit portion 110 in the printed circuit board assembly 500. In other words, both the surface 201 and the surface 202 face the first electrodes 120 of the first printed circuit board 100. The second electrodes 220 are therefore arranged on both the surface 201 and the surface 202 in the printed circuit board assembly 500. The second electrodes 220 are located on the protrusion 230 of the end portion 203 of the second printed circuit board 200. The first electrodes 120 are soldered in one-to-one correspondence to the second electrodes 220.

To assemble the printed circuit board assembly 500, as illustrated in FIG. 2, the protrusion 230 of the end portion 203 of the second printed circuit board 200 is inserted into the slit portion 110 from the surface 101 of the first printed circuit board 100. Subsequently, as illustrated in FIG. 3, the second electrodes 220 of the second printed circuit board 200 are soldered to the first electrodes 120 of the first printed circuit board 100, so that the printed circuit board assembly 500 is completed.

In this case, a tip of the end portion 203 of the second printed circuit board 200 protrudes from the surface 102 of the first printed circuit board 100. Solder joints 2 between the first electrodes 120 and the second electrodes 220 have solder fillets. An electronic component (not illustrated) mounted on the second printed circuit board 200 is disposed on at least one of the surface 201 and the surface 202 and is located between the surface 101 of the first printed circuit board 100 and a tip of the end portion 204 of the second printed circuit board 200.

Figure 4:
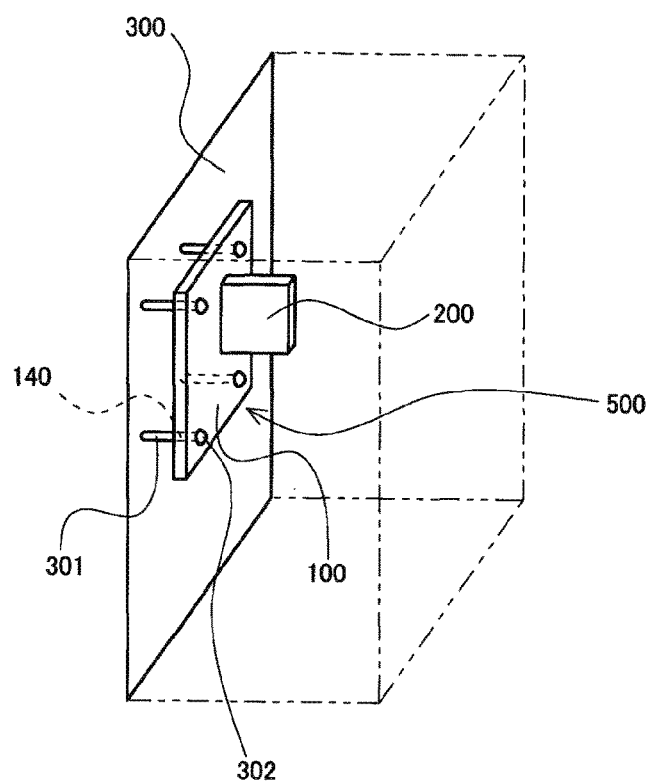
FIG. 4 is a perspective view illustrating the related art printed circuit board assembly incorporated in an apparatus.
Figure 5:
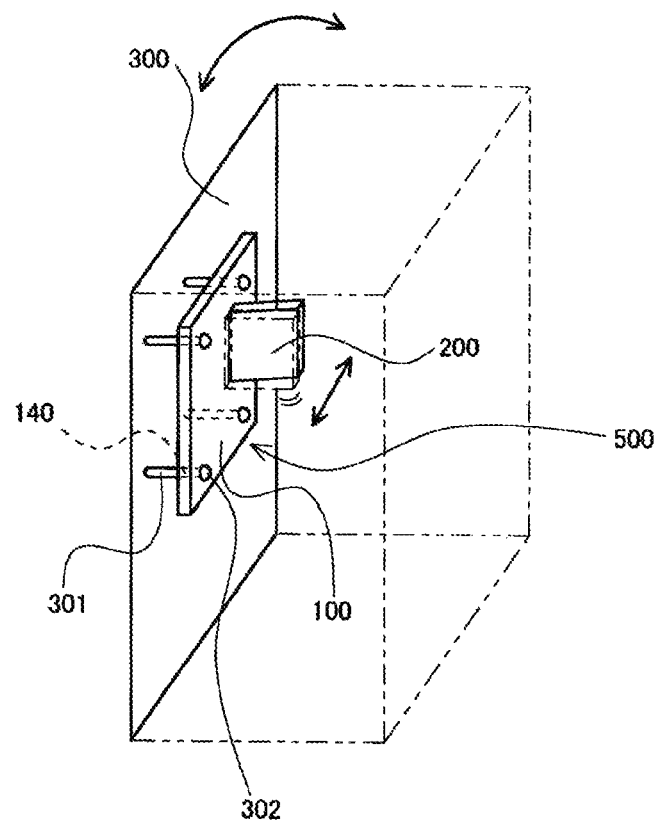
FIG. 5 is a perspective view illustrating a vibration state of the related art printed circuit board assembly incorporated in the apparatus.

FIG. 4 is a perspective view illustrating the related art printed circuit board assembly incorporated in an apparatus. FIG. 5 is a perspective view illustrating a vibration state of the related art printed circuit board assembly incorporated in the apparatus. In FIG. 5, a double-ended arcuate arrow depicted by a thick line represents a vibration state of a mounting component 300 on which the printed circuit board assembly 500 is mounted. In FIG. 5, a double-ended linear arrow depicted by a thick line represents a vibration state of the second printed circuit board 200 in the printed circuit board assembly 500.

The printed circuit board assembly 500 is incorporated as part of, for example, a controller, in the apparatus. In this case, the first printed circuit board 100 of the printed circuit board assembly 500 is secured to the mounting component 300 included in the apparatus. Examples of the apparatus include an air-conditioning apparatus and a refrigeration apparatus. The mounting component 300 is, for example, a control box made of a metal sheet. For mounting the printed circuit board assembly 500 to the mounting component 300 in FIG. 4, the printed circuit board assembly 500 has a plurality of through-holes 140, which are mounting parts, arranged in the first printed circuit board 100. The mounting component 300 includes a plurality of spacers 301 made of resin or metal. These spacers 301 each have a female thread. A male-threaded screw 302 is inserted into each through-hole 140 of the first printed circuit board 100 and is then fitted into the female thread of the corresponding one of the spacers 301, so that the first printed circuit board 100 of the printed circuit board assembly 500 is secured to the mounting component 300.

While the apparatus is being transported or being operated, the apparatus vibrates. In other words, while the apparatus is being transported or being operated, the mounting component 300 of the apparatus vibrates. Consequently, vibration of the mounting component 300 is transmitted to the printed circuit board assembly 500 secured to the mounting component 300. In the printed circuit board assembly 500, the first printed circuit board 100 and the second printed circuit board 200 are fixed to each other only by the solder joints 2. Consequently, when the second printed circuit board 200 vibrates, large stress is generated in the solder joints 2 of the printed circuit board assembly 500 as compared with a printed circuit board assembly 1 according to Embodiment 1, which will be described later. Furthermore, when vibration of the mounting component 300 is transmitted to the printed circuit board assembly 500, the second printed circuit board 200 bends. The second printed circuit board 200 experiences large bending, particularly in a direction illustrated in FIGS. 6 and 7, which will be described below.

Figure 6:
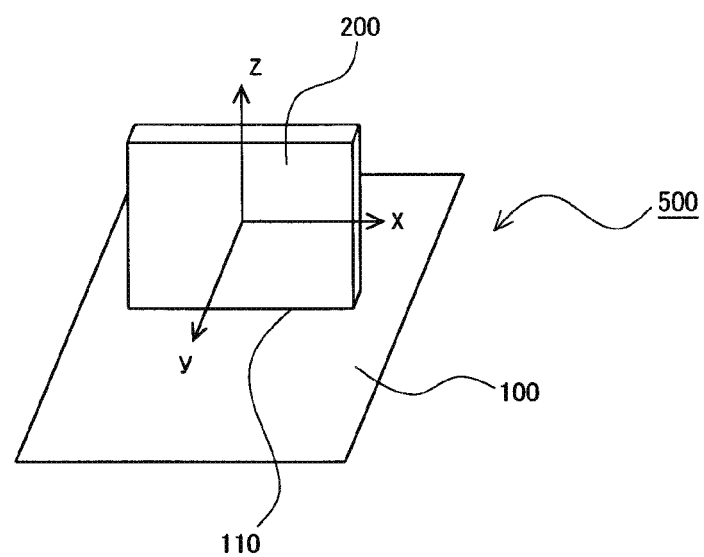
FIG. 6 is a perspective view of the related art printed circuit board assembly.
Figure 7:
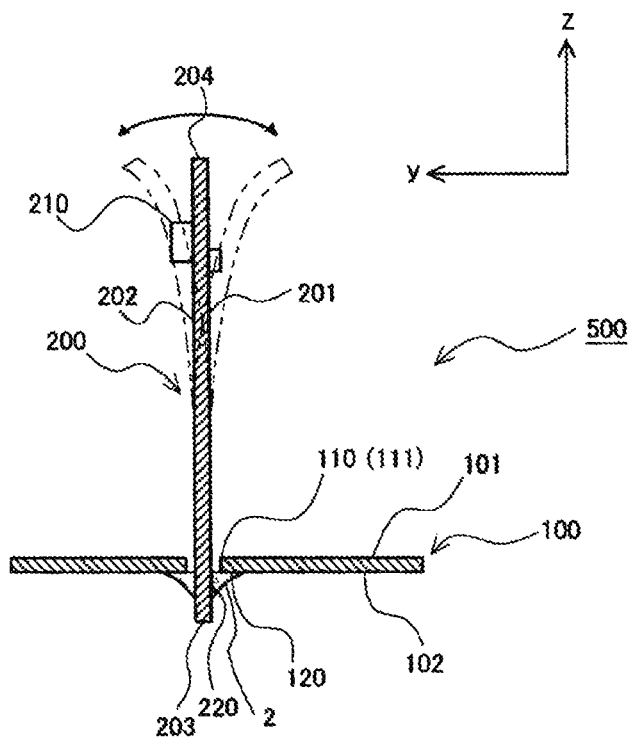
FIG. 7 is a cross-sectional view of the related art printed circuit board assembly.

FIG. 6 is a perspective view of the related art printed circuit board assembly. FIG. 7 is a cross-sectional view of the related art printed circuit board assembly. FIG. 7 illustrates the same cross-section of the related art printed circuit board assembly 500 as the cross-section in FIG. 3. In other words, FIG. 7 illustrates the cross-section of the related art printed circuit board assembly 500 taken in a direction orthogonal to an x-axis direction in FIG. 6. In other words, FIG. 7 illustrates the cross-section of the related art printed circuit board assembly 500 taken in a y-axis direction in FIG. 6. FIG. 7 also illustrates electronic components 210 mounted on the second printed circuit board 200. Examples of the electronic components 210 include a ceramic capacitor and a chip resistor.

As illustrated in FIG. 6, the longitudinal direction of the slit portion 110 of the first printed circuit board 100 is defined as the x-axis direction. In other words, the x-axis direction is a direction along the width of the second printed circuit board 200. Of directions orthogonal to the x-axis direction, as illustrated in FIG. 6, the lateral direction of the slit portion 110 of the first printed circuit board 100 is defined as the y-axis direction. In other words, the y-axis direction is a direction along the thickness of the second printed circuit board 200 corresponding to the distance between the surface 201 and the surface 202. Furthermore, as illustrated in FIG. 6, a direction orthogonal to the x-axis direction and the y-axis direction is defined as a z-axis direction. The z-axis direction is a direction perpendicular to the surface 101 of the first printed circuit board 100.

The x-axis direction, the y-axis direction, and the z-axis direction are defined as described above. In this case, upon transmission of vibration of the mounting component 300 to the printed circuit board assembly 500, a component in the y-axis direction, or the thickness direction, of vibration of the second printed circuit board 200 is the largest as illustrated in FIG. 7. In other words, upon transmission of vibration of the mounting component 300 to the printed circuit board assembly 500, a component in the y-axis direction of stress generated in the solder joints 2 of the printed circuit board assembly 500 is the largest. Specifically, vibration of the mounting component 300 transmitted to the printed circuit board assembly 500 causes the second printed circuit board 200 to greatly bend in the y-axis direction, or the thickness direction.

While an object Z is vibrating, when an object Y having the same natural frequency as the natural frequency of the object Z is attached to the vibrating object Z, a resonance phenomenon is typically caused in which the objects vibrate with a larger amplitude. Such a resonance phenomenon occurs at a specific natural frequency. The natural frequency can also be called a resonance frequency.

When the apparatus incorporating the printed circuit board assembly 500 is, for example, an air-conditioning apparatus or a refrigeration apparatus, the apparatus vibrates while a compressor is being driven or while the apparatus is being transported. In such a case, the apparatus vibrates at a frequency ranging from approximately 5 Hz to approximately 150 Hz. As the first printed circuit board 100 and the second printed circuit board 200 of the printed circuit board assembly 500 have a natural frequency outside the above-described frequency range, no resonance phenomenon occurs. However, the natural frequency of the mounting component 300 on which the printed circuit board assembly 500 is mounted changes depending on, for example, the structure and weight of the mounting component 300. The mounting component 300 may therefore resonate while the compressor is being driven or while the apparatus is being transported. Resonance of the mounting component 300 causes the mounting component 300 to vibrate with a larger amplitude.

The resonance of the mounting component 300 also causes the printed circuit board assembly 500 mounted on the mounting component 300 to vibrate with a larger amplitude. In other words, the printed circuit board assembly 500 vibrates greatly at the natural frequency of the mounting component 300. This vibration results in an increase in stress that is generated in the solder joints 2 of the printed circuit board assembly 500 and an increase in the amount of bending of the second printed circuit board 200. Thus, the printed circuit board assembly 500 has the following two problems.

The first problem is that intermittent application of large stress to the solder joints 2 of the printed circuit board assembly 500 causes fatigue failure of the solder joints 2 and may lead to fracture of the solder joints 2.

Figure 8:
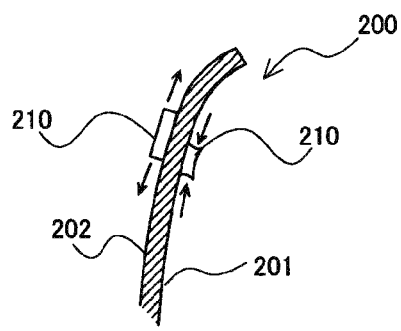
FIG. 8 is a sectional view illustrating a bending state of the second printed circuit board in the related art printed circuit board assembly and illustrating a region including a portion of the second printed circuit board on which electronic components are mounted.

The second problem is that, as illustrated in FIG. 8, large bending of the second printed circuit board 200 causes large stress to be generated in the electronic components 210 mounted on the second printed circuit board 200 and may lead to breakdown or failure of the electronic components 210.

FIG. 8 is a sectional view illustrating a bending state of the second printed circuit board in the related art printed circuit board assembly and illustrating a region including a portion of the second printed circuit board on which the electronic components are mounted. FIG. 8 illustrates the same cross-section as the cross-section in FIG. 7 and illustrates the region including the portion of the second printed circuit board 200 on which the electronic components 210 are mounted.

To solve at least the first problem of the above-described two problems, the printed circuit board assembly 1 according to Embodiment 1 is configured as follows. Note that the same components of the printed circuit board assembly 1 according to Embodiment 1 as the components of the related art printed circuit board assembly 500 are designated by the same reference signs. Furthermore, note that a component of the printed circuit board assembly 1 according to Embodiment 1 that will not be described below is the same as the component of the related art printed circuit board assembly 500.

Figure 9:
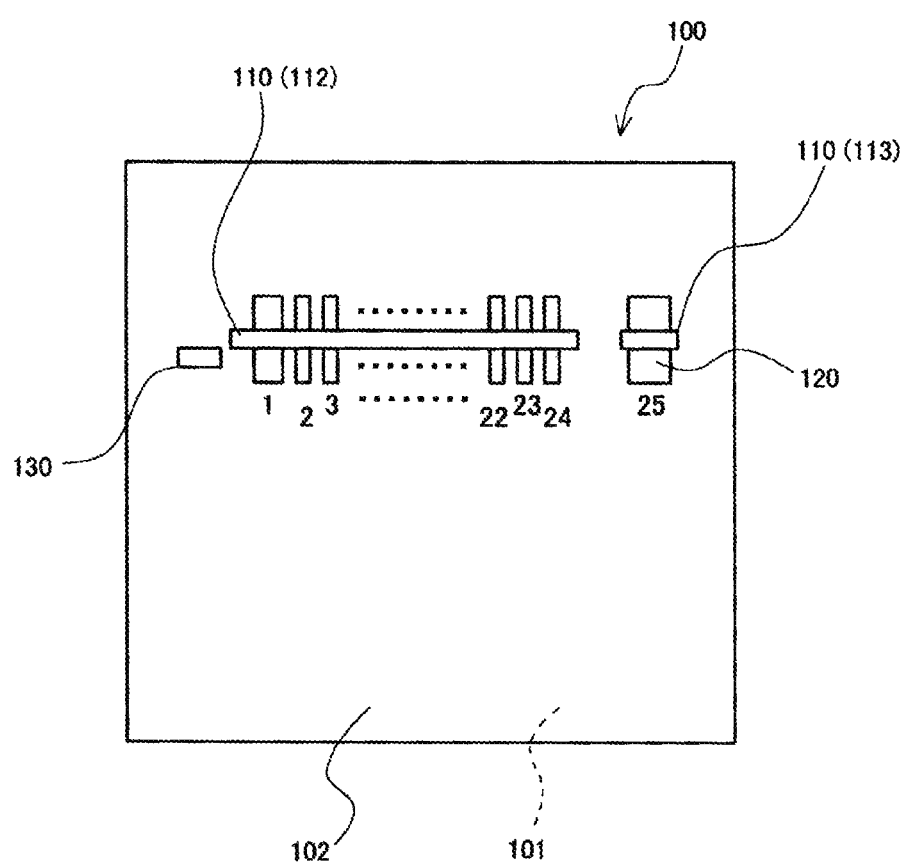
FIG. 9 is a diagram illustrating a first printed circuit board included in a printed circuit board assembly according to Embodiment 1 of the present disclosure.
Figure 10:
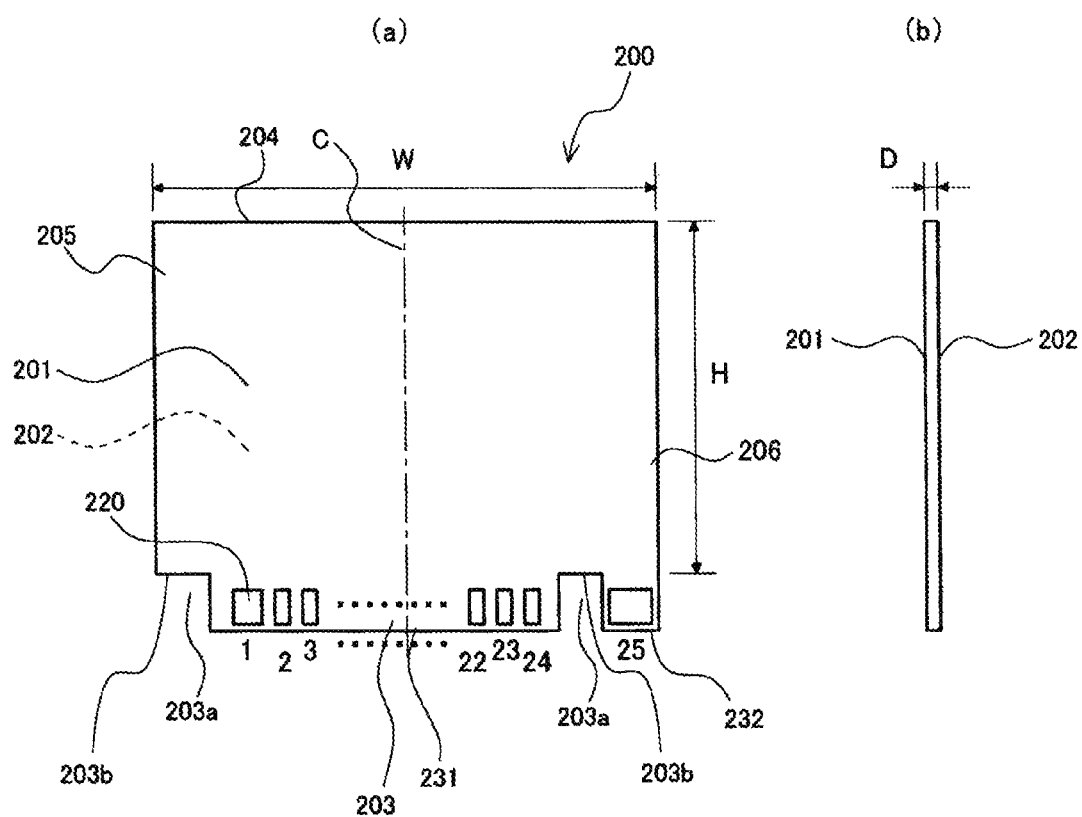
FIG. 10 includes diagrams illustrating a second printed circuit board included in the printed circuit board assembly according to Embodiment 1 of the present disclosure.
Figure 11:
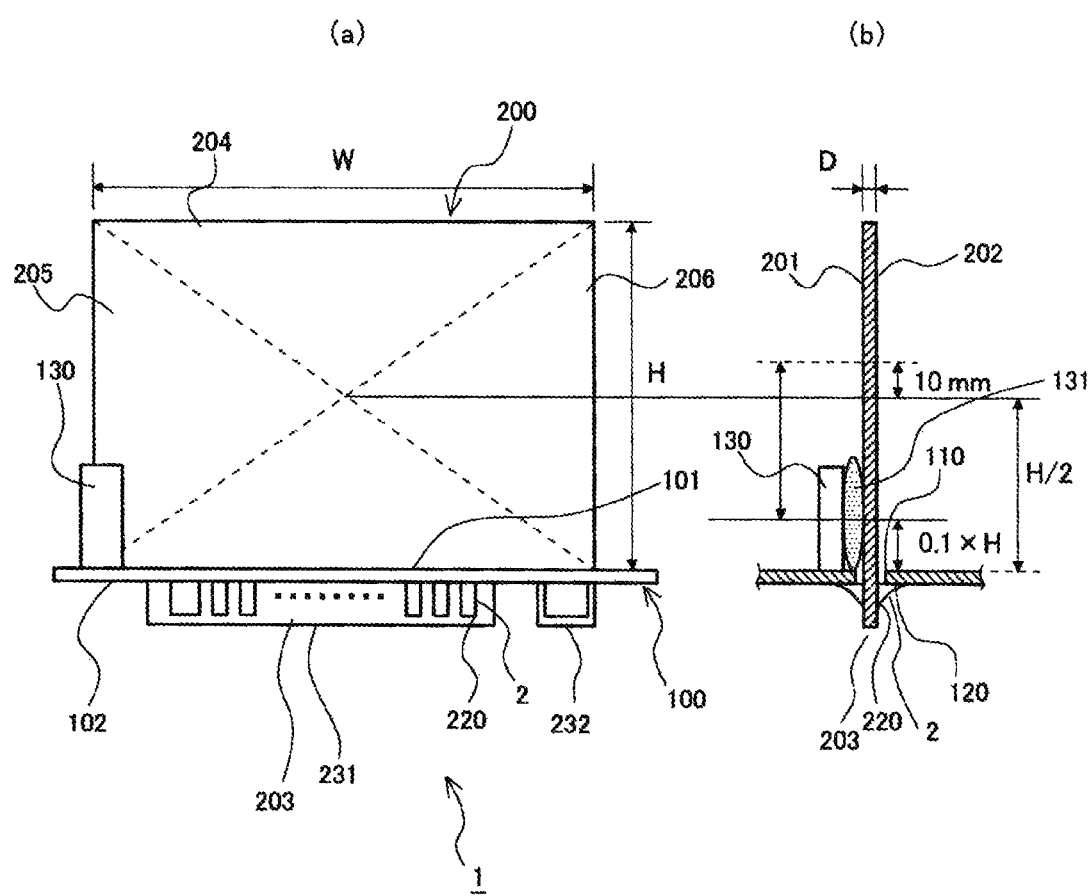
FIG. 11 includes diagrams illustrating the printed circuit board assembly according to Embodiment 1 of the present disclosure.

FIG. 9 is a diagram illustrating a first printed circuit board included in the printed circuit board assembly according to Embodiment 1 of the present disclosure. FIG. 10 includes diagrams illustrating a second printed circuit board included in the printed circuit board assembly according to Embodiment 1 of the present disclosure. FIG. 11 includes diagrams illustrating the printed circuit board assembly according to Embodiment 1 of the present disclosure. FIG. 10(*a*) illustrates a second printed circuit board 200 of the printed circuit board assembly 1 according to Embodiment 1 as viewed from a front of a surface 201. FIG. 10(*b*) is a side view of FIG. 10(*a*). FIG. 11(*a*) illustrates the printed circuit board assembly 1 as viewed in a direction perpendicular to the surface 201 of the second printed circuit board 200. FIG. 11(*b*) illustrates a cross-section of the printed circuit board assembly 1 taken in a direction orthogonal to a longitudinal direction of a slit portion 110 of a first printed circuit board 100.

The printed circuit board assembly 1 according to Embodiment 1 includes a support 130 in addition to the same components as the components of the related art printed circuit board assembly 500. The slit portion 110 and an end portion 203 of the second printed circuit board 200 in the printed circuit board assembly 1 according to Embodiment 1 differ in shape from the slit portion 110 and the end portion 203 in the related art printed circuit board assembly 500. However, the shape of the slit portion 110 and the shape of the end portion 203 of the second printed circuit board 200 in the printed circuit board assembly 1 according to Embodiment 1 are not limited to the shapes described below. The shape of the slit portion 110 and the shape of the end portion 203 of the second printed circuit board 200 in the printed circuit board assembly 1 according to Embodiment 1 may be the same as the shapes of the slit portion 110 and the end portion 203 in the related art printed circuit board assembly 500.

Specifically, the end portion 203 of the second printed circuit board 200 in the printed circuit board assembly 1 according to Embodiment 1 has a notch 203*a* at one end of the end portion 203 and another notch 203*a* at a position other than opposite ends of the end portion 203 in the longitudinal direction of the slit portion 110. Consequently, the end portion 203 has two protrusions. Specifically, the end portion 203 includes a protrusion 231 and a protrusion 232. Second electrodes 220 are each disposed on the corresponding one of the protrusions 231 and 232. The slit portion 110 of the first printed circuit board 100 in the printed circuit board assembly 1 according to Embodiment 1 has two slits arranged in one-to-one correspondence to the protrusion 231 and the protrusion 232. Specifically, the slit portion 110 includes a slit 112 to receive the protrusion 231 and a slit 113 to receive the protrusion 232.

A surface 101 of the first printed circuit board 100 in the printed circuit board assembly 1 corresponds to a first surface in the present disclosure. A surface 102 of the first printed circuit board 100 in the printed circuit board assembly 1 corresponds to a second surface in the present disclosure. The surface 201 of the second printed circuit board 200 in the printed circuit board assembly 1 corresponds to a third surface in the present disclosure. A surface 202 of the second printed circuit board 200 in the printed circuit board assembly 1 corresponds to a fourth surface in the present disclosure. The end portion 203 of the second printed circuit board 200 in the printed circuit board assembly 1 corresponds to a first end portion in the present disclosure. An end portion 204 of the second printed circuit board 200 in the printed circuit board assembly 1 corresponds to a second end portion in the present disclosure.

The support 130 of the printed circuit board assembly 1 according to Embodiment 1 is fixed to the surface 101 of the first printed circuit board 100. The support 130 is, for example, a connector, a heat sink, or an electrolytic capacitor. The support 130 is fixed to the surface 101 of the first printed circuit board 100 by, for example, soldering. The second printed circuit board 200 of the printed circuit board assembly 1 according to Embodiment 1 is attached to the support 130 by an adhesive substance 131. Such a configuration of the printed circuit board assembly 1 according to Embodiment 1 allows stress that is applied to solder joints 2 between first electrodes 120 of the first printed circuit board 100 and the second electrodes 220 of the second printed circuit board 200 to be smaller than stress in the related art. This configuration of the printed circuit board assembly 1 according to Embodiment 1 reduces the likelihood of fatigue fracture of the solder joints 2 as compared with the configuration of the related art.

Examples of materials usable for the adhesive substance 131 include, but are not limited to, cold setting silicone resin, thermosetting silicone resin, hot-melt adhesive, and thermosetting epoxy resin. Although only one support 130 is attached to the second printed circuit board 200 in Embodiment 1, any number of supports 130 may be attached to the second printed circuit board 200. For example, two or more supports 130 may be fixed to the surface 101 of the first printed circuit board 100 and these supports 130 may be attached to the second printed circuit board 200 with the adhesive substance 131.

As will be described later, the first electrodes 120 of the first printed circuit board 100 and the second electrodes 220 of the second printed circuit board 200 in the printed circuit board assembly 1 may be joined by wave soldering. In such a case, it is preferred to attach the support 130 to the second printed circuit board 200 with the adhesive substance 131 after wave soldering for the following reasons. For example, depending on the material of the adhesive substance 131, the adhesive substance 131 can melt while the adhesive substance 131 is passing through a wave-soldering bath during wave soldering. The adhesive substance 131 can be prevented from melting by attaching the support 130 to the second printed circuit board 200 with the adhesive substance 131 after wave soldering. Furthermore, the first printed circuit board 100 and the second printed circuit board 200 are heated while the first printed circuit board 100 and the second printed circuit board 200 are passing through the wave-soldering bath during wave soldering. In other words, the first printed circuit board 100 and the second printed circuit board 200 are at room temperature before the first printed circuit board 100 and the second printed circuit board 200 enter the wave-soldering bath, reach high temperature in the wave-soldering bath, and cool back to the room temperature after the first printed circuit board 100 and the second printed circuit board 200 leave the wave-soldering bath. Such changes in temperature cause the first printed circuit board 100 and the second printed circuit board 200 to thermally expand and then shrink. In this case, the first printed circuit board 100 and the second printed circuit board 200 can have the same or similar coefficients of linear expansion. If the support 130 is not attached to the second printed circuit board 200 with the adhesive substance 131, thermal expansion and shrinkage of the first printed circuit board 100 and the second printed circuit board 200 arising from wave soldering will not cause the solder joints 2 to experience large stress. The difference in linear expansion coefficient between the support 130 and each of the first printed circuit board 100 and the second printed circuit board 200 is greater than the difference in linear expansion coefficient between the first printed circuit board 100 and the second printed circuit board 200. For this reason, if the support 130 is attached to the second printed circuit board 200 with the adhesive substance 131 before wave soldering, thermal expansion and shrinkage of the first printed circuit board 100, the second printed circuit board 200, and the support 130 arising from wave soldering may cause the solder joints 2 to experience large stress. Attaching the support 130 to the second printed circuit board 200 with the adhesive substance 131 after wave soldering therefore reduces or eliminates the likelihood that the solder joints 2 may experience large stress during wave soldering.

A distance from the surface 101 of the first printed circuit board 100 to a tip of the end portion 204 of the second printed circuit board 200 is defined as a height H. In this case, the support 130 is attached to the second printed circuit board 200 with the adhesive substance 131 preferably at the following position in the distance from the surface 101 of the first printed circuit board 100 to the tip of the end portion 204 of the second printed circuit board 200.

Figure 12:
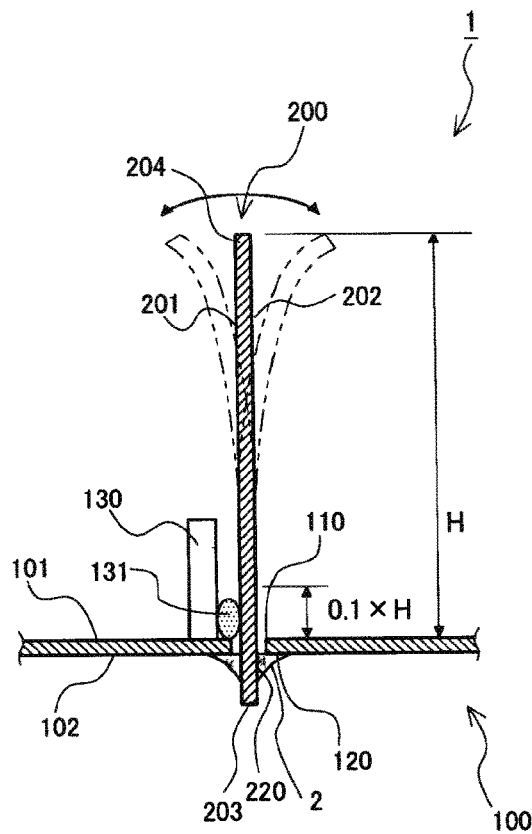
FIG. 12 is a cross-sectional view of another example of the printed circuit board assembly according to Embodiment 1 of the present disclosure.

FIG. 12 is a cross-sectional view of another example of the printed circuit board assembly according to Embodiment 1 of the present disclosure. FIG. 12 illustrates a cross-section of another example of the printed circuit board assembly 1 according to Embodiment 1 taken in the same manner as in FIG. 11(b).

In the printed circuit board assembly 1 of FIG. 12, a distance by which part of the second printed circuit board 200 that is attached to the support 130 extends from the surface 101 of the first printed circuit board 100 is shorter than 0.1×H. In such a case, the distance between a location at which the second printed circuit board 200 is attached to the support 130 and the solder joints 2 is short. This arrangement can reduce stress that is generated in the solder joints 2 when the printed circuit board assembly 1 vibrates. However, the distance from the location at which the second printed circuit board 200 is attached to the support 130 to the tip of the end portion 204 of the second printed circuit board 200 is long. This arrangement causes the second printed circuit board 200 to bend greatly when the printed circuit board assembly 1 vibrates. This bending results in a reduction in the effect of alleviating stress that is generated in the electronic components 210 mounted on the second printed circuit board 200. In other words, this bending results in a reduction in the effect of reducing the likelihood of failure of the electronic components 210.

In contrast, in the printed circuit board assembly 1 of FIG. 11, part of the second printed circuit board 200 corresponding to a distance of 0.1×H or more from the surface 101 of the first printed circuit board 100 toward the end portion 204 is attached to the support 130. This arrangement in the printed circuit board assembly 1 of FIG. 11 can alleviate stress that is generated in the electronic components 210 mounted on the second printed circuit board 200 as compared with the arrangement in the printed circuit board assembly 1 of FIG. 12. In other words, attaching the part of the second printed circuit board 200 corresponding to a distance of 0.1×H or more from the surface 101 of the first printed circuit board 100 toward the end portion 204 to the support 130 can reduce the likelihood of fatigue fracture of the solder joints 2 as well as the likelihood of failure of the electronic components 210.

Figure 13:
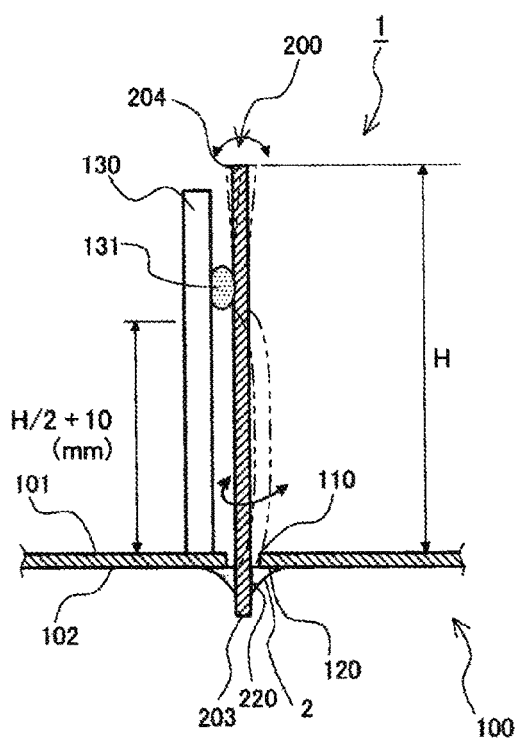
FIG. 13 is a cross-sectional view of another example of the printed circuit board assembly according to Embodiment 1 of the present disclosure.

FIG. 13 is a cross-sectional view of another example of the printed circuit board assembly according to Embodiment 1 of the present disclosure. FIG. 13 illustrates a cross-section of another example of the printed circuit board assembly 1 according to Embodiment 1 taken in the same manner as in FIG. 11(b).

In the printed circuit board assembly 1 of FIG. 13, the distance between a position at which the second printed circuit board 200 is attached to the support 130 and the surface 101 of the first printed circuit board 100 is longer than (H/2)+10 mm. In such a case, the distance between the position at which the second printed circuit board 200 is attached to the support 130 and the solder joints 2 is long. In this arrangement, part of the second printed circuit board 200 that is located between the position at which the second printed circuit board 200 is attached to the support 130 and the solder joints 2 may bend. This bending causes stress to be generated in the solder joints 2, and the stress lowers the effect of reducing the likelihood of fatigue fracture of the solder joints 2.

In contrast, in the printed circuit board assembly 1 of FIG. 11, part of the second printed circuit board 200 is attached to the support 130 within a distance of ((H/2)+10 mm) or less from the surface 101 of the first printed circuit board 100. This arrangement in the printed circuit board assembly 1 of FIG. 11 can reduce the amount of bending of part of the second printed circuit board 200 that is located between the solder joints 2 and the location at which the second printed circuit board 200 is attached to the support 130 as compared with the arrangement in the printed circuit board assembly 1 of FIG. 13. In other words, attaching the part of the second printed circuit board 200 to the support 130 within a distance of ((H/2)+10 mm) or less from the surface 101 of the first printed circuit board 100 can reduce the likelihood of fatigue fracture of the solder joints 2 as well as the likelihood of failure of the electronic components 210.

The first electrodes 120 of the first printed circuit board 100 and the second electrodes 220 of the second printed circuit board 200 in the printed circuit board assembly 1 according to Embodiment 1 are joined by wave soldering. Specifically, to manufacture the printed circuit board assembly 1, the first printed circuit board 100 and the second printed circuit board 200 assembled in such a manner that the end portion 203 of the second printed circuit board 200 is fitted in the slit portion 110 of the first printed circuit board 100 are conveyed by a conveyor belt in the wave-soldering bath. During conveyance, the first electrodes 120 and the second electrodes 220 are sprayed with molten solder, so that the first electrodes 120 are soldered to the second electrodes 220.

For the printed circuit board assembly 1 according to Embodiment 1, the first printed circuit board 100 and the second printed circuit board 200 are conveyed in the longitudinal direction of the slit portion 110 during wave soldering. Specifically, the second printed circuit board 200 includes an end portion 205 and an end portion 206 arranged in the longitudinal direction of the slit portion 110 as illustrated in FIG. 11, for example. The end portion 205 is a leading end in a conveying direction during wave soldering. The end portion 205 of the second printed circuit board 200 in the printed circuit board assembly 1 corresponds to a third end portion in the present disclosure. The end portion 206 of the second printed circuit board 200 in the printed circuit board assembly 1 corresponds to a fourth end portion in the present disclosure.

In such a case where the first printed circuit board 100 and the second printed circuit board 200 are subjected to wave soldering while the first printed circuit board 100 and the second printed circuit board 200 are being conveyed, the amount of solder of the solder joint 2 adjacent to the leading end in the conveying direction is smaller than the amount of solder of the solder joint 2 adjacent to a trailing end in the conveying direction. In other words, the amount of solder deposited on the second electrode 220 closest to the end portion 205 of the multiple second electrodes 220 is smaller than the amount of solder deposited on the second electrode 220 closest to the end portion 206 of the multiple second electrodes 220. Specifically, the solder joint 2 adjacent to the end portion 205, which is the leading end in the conveying direction, exhibits smaller resistance to stress than does the solder joint 2 adjacent to the end portion 206, which is the trailing end in the conveying direction.

For this reason, in the printed circuit board assembly 1 according to Embodiment 1, the second printed circuit board 200 is attached at the end portion 205 to the support 130. In Embodiment 1, the end portion 205 is defined as a portion between a tip of the end portion 205 and the second electrode 220 closest to the end portion 205 of the multiple second electrodes 220.

As will be described later, for the solder joints 2 joining the first electrodes 120 and the second electrodes 220, as the solder joint 2 is closer to the end portion 205 or the end portion 206, the solder joint 2 experiences larger stress than does the solder joint 2 located at the middle in the longitudinal direction of the slit portion 110. In a case where wave soldering is performed in the above-described manner, the solder joint 2 adjacent to the end portion 205, which is the leading end in the conveying direction, exhibits smaller resistance to stress than does the solder joint 2 adjacent to the end portion 206, which is the trailing end in the conveying direction. In the case where wave soldering is performed in the above-described manner, attaching the second printed circuit board 200 at the end portion 205 to the support 130 can therefore further reduce the likelihood of fatigue fracture of the solder joints 2.

In Embodiment 1, the second printed circuit board 200 has the following dimensions. As illustrated in FIG. 11, the second printed circuit board 200 has a thickness D, which is the distance between the surface 201 and the surface 202. The thickness D of the second printed circuit board 200 in Embodiment 1 is 1.4 mm or more and 1.8 mm or less. The second printed circuit board 200 in Embodiment 1 has a height H, which is the distance from the surface 101 of the first printed circuit board 100 to the tip of the end portion 204 of the second printed circuit board 200, of 25 mm or more and 60 mm or less.

The amount of bending due to vibration changes depending on the thickness D. Furthermore, the amount of bending of the second printed circuit board 200 due to vibration and the magnitude of stress that is generated in the solder joints 2 due to vibration change depending on the height H. Specifically, the larger the height H, the larger the magnitude of stress that is generated in the solder joints 2 due to vibration.

For example, according to Mechanical Engineers' Handbook published by Japan Society of Mechanical Engineers (JSME), when a cylinder having a fixed end vibrates, the following stress σ is generated in the fixed end.

$$\sigma = L^3/(3EI)$$

L denotes the height of the cylinder, E denotes Young's modulus, and I denotes the moment of inertia of the cross-sectional area of the cylinder.

Specifically, when the cylinder having the fixed end vibrates, the stress σ generated in the fixed end is proportional to the cube of the height L of the cylinder. In the printed circuit board assembly 1 according to Embodiment 1, the larger the height H of the second printed circuit board 200, the larger the magnitude of stress that is generated in the solder joints 2 due to vibration of the second printed circuit board 200, as in the cylinder when the cylinder vibrates.

From the above-described points of view, the second printed circuit board 200 having a thickness D of 1.4 mm or more and 1.8 mm or less in Embodiment 1 has a height H of 25 mm or more. With a height H of less than 25 mm, stress that is generated in the solder joints is small and the likelihood of fatigue fracture of the solder joints 2 can be reduced if the second printed circuit board 200 is not attached to the support 130. In other words, as long as the height H is less than 25 mm, the configuration of the related art printed circuit board assembly 500 can reduce the likelihood of fatigue fracture of the solder joints 2. Furthermore, a height H of more than 60 mm leads to the difficulty of manufacturing the second printed circuit board 200, which is a challenge different from the challenge of reducing the likelihood of fatigue fracture of the solder joints 2. For these reasons, the second printed circuit board 200 having a thickness D of 1.4 mm or more and 1.8 mm or less in Embodiment 1 has a height H of 60 mm or less.

As illustrated in FIG. 11, the dimension of the second printed circuit board 200 in the longitudinal direction of the slit portion is a width W. The width W of the second printed circuit board 200 in Embodiment 1 is one to two times as long as the height H. For the solder joints 2 joining the first electrodes 120 and the second electrodes 220, as the solder joint 2 is farther from the location at which the second printed circuit board 200 is attached to the support 130 in the longitudinal direction of the slit portion 110, the solder joint 2 experiences larger stress. For this reason, if the ratio of the width W to the height H increases, multiple supports 130 may need to be attached to the second printed circuit board 200 to reduce the likelihood of fatigue fracture of the solder joints 2. For the second printed circuit board 200 having the above-described thickness D and the above-described height H, the width W is one to two times as long as the height H. Consequently, the likelihood of fatigue fracture of the solder joints 2 is reduced by attaching the single support 130 to the second printed circuit board 200. The likelihood of failure of the electronic components 210 can also be reduced.

As illustrated in FIG. 10, in the second printed circuit board 200 in Embodiment 1, the number of second electrodes 220 arranged in the longitudinal direction of the slit portion 110 to face one side of the slit portion 110 in the lateral direction of the slit portion 110 is 25 or less. In other words, as illustrated in FIG. 9, in the first printed circuit board 100 in Embodiment 1, the number of first electrodes 120 arranged along the slit portion 110 in the longitudinal direction of the slit portion 110 is 25 or less on one side of the slit portion 110 in the lateral direction of the slit portion 110.

The resistance to stress of the solder joints 2 depends on the joining strength of the solder joints 2. The resistance to stress of the solder joints 2 also depends on the number of solder joints 2, or the number of first electrodes 120 and the number of second electrodes 220. The applicant has manufactured a related art printed circuit board assembly including the second printed circuit board 200 in Embodiment 1 and including no support 130. In this related art printed circuit board assembly, in a case where the number of second electrodes 220 arranged in the longitudinal direction of the slit portion 110 is greater than 25 on one side of the slit portion 110 in the lateral direction of the slit portion 110, the area of each second electrode 220 needs to be reduced. In other words, the area of each first electrode 120 needs to be reduced.

The tensile strength of each solder joint 2 in the related art printed circuit board assembly including the second printed circuit board 200 in Embodiment 1 was measured. Specifically, the tensile strength of solder with which each of the first electrodes 120 was joined to the corresponding one of the second electrodes 220 was measured. The term "tensile strength" as used herein refers to a tensile load that the solder joint 2 can withstand without fracturing. As a result, a minimum tensile strength of each solder joint 2 was 16 N.

According to Mechanical Engineers' Handbook published by JSME, a fatigue failure load of one solder joint 2 is obtained as follows. The term "fatigue failure load" as used herein refers to a load that causes fracture of one solder joint 2 when the load is repeatedly applied to the solder joint 2 by vibration.

Fatigue failure load=tensile stress×(0.33 to 0.59)

Specifically, a minimum fatigue failure load of one solder joint 2 is obtained as follows.

Minimum fatigue failure load=tensile strength×0.33

A minimum fatigue failure load of each solder joint 2 in the related art printed circuit board assembly including the second printed circuit board 200 in Embodiment 1 is therefore obtained as follows.

Minimum fatigue failure load=16 [N]×0.33=5.28 [N]

In the related art printed circuit board assembly including the second printed circuit board 200 in Embodiment 1, or the related art printed circuit board assembly with the above-described measured tensile strength, the area of each first electrode 120 was 4.5 mm². Similarly, the area of each second electrode 220 was 4.5 mm². A minimum fatigue failure stress in the related art printed circuit board assembly including the second printed circuit board 200 in Embodiment 1 is as follows. The term "fatigue failure stress" as used herein refers to stress that does not cause fatigue fracture of one solder joint 2 even when the stress is repeatedly generated in the solder joint 2. Specifically, as long as stress that is repeatedly generated in each solder joint 2 is less than the following fatigue failure stress, the likelihood of fatigue fracture of the solder joint 2 caused by vibration of the second printed circuit board 200 can be reduced.

Minimum fatigue failure stress=minimum fatigue failure load/area of electrode=5.28 [*N*]/4.5 [mm²]=1.08 [MPa]

This description reveals that the smaller the area of each first electrode 120 and the area of each second electrode 220, the smaller the fatigue failure stress of each solder joint 2, or the smaller the resistance to stress of each solder joint 2.

The resistance to stress of the entire printed circuit board assembly can be considered as the product of the resistance to stress of each solder joint 2 multiplied by the number of first electrodes 120, or the number of second electrodes 220. In this sense, as long as the number of first electrodes 120 and the number of second electrodes 220 increase, the resistance to stress of the entire printed circuit board assembly is likely to remain unchanged even if the resistance to stress of each solder joint 2 decreases.

Figure 14:
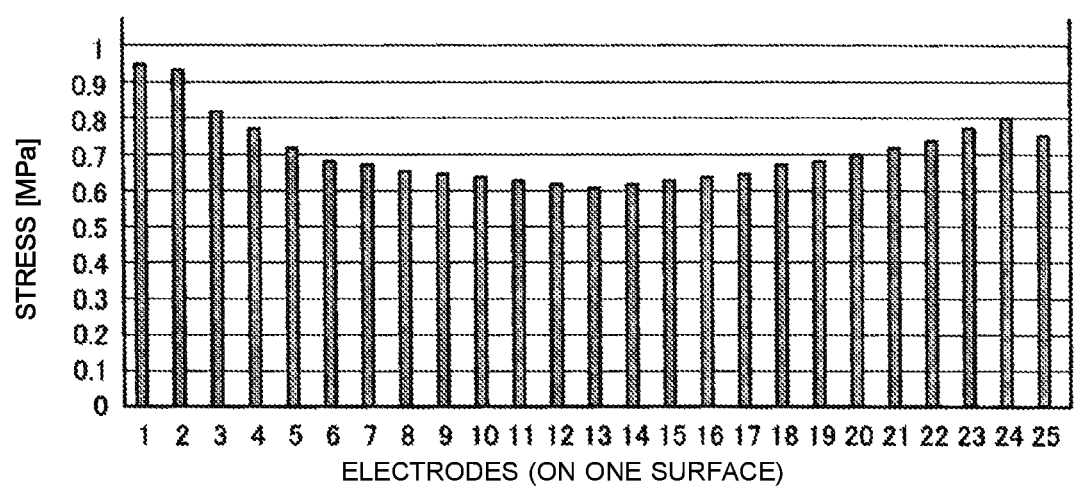
FIG. 14 is a graph illustrating stresses generated in solder joints during vibration in a related art printed circuit board assembly including a second printed circuit board 200 in Embodiment 1 of the present disclosure.

Of the solder joints 2 arranged in the longitudinal direction of the slit portion 110, however, the solder joint 2 adjacent to each end portion experiences large stress as illustrated in FIG. 14 when the second printed circuit board 200 vibrates. When the likelihood of fatigue fracture of the solder joint 2 adjacent to the end portion is considered, it is preferred that the number of second electrodes 220 arranged in the longitudinal direction of the slit portion 110 on one side of the slit portion 110 in the lateral direction of the slit portion 110 be 25 or less. In other words, it is preferred that the number of first electrodes 120 arranged along the slit portion 110 in the longitudinal direction of the slit portion 110 on one side of the slit portion 110 in the lateral direction of the slit portion 110 be 25 or less.

FIG. 14 illustrates stresses generated in the solder joints during vibration in the related art printed circuit board assembly including the second printed circuit board 200 in Embodiment 1 of the present disclosure. In FIG. 14, the horizontal axis represents the second electrodes 220 in FIG. 10. In other words, the horizontal axis of FIG. 14 represents the solder joints 2 joining the second electrodes 220 to the first electrodes 120. For example, a numeral "1" on the horizontal axis of FIG. 14 represents the solder joint 2 joining the second electrode 220 at a position "1" in FIG. 10. In FIG. 14, the vertical axis represents the stresses generated in the solder joints 2 during vibration of the second printed circuit board 200. The values of stresses illustrated in FIG. 14 are merely examples.

To reduce the likelihood of fatigue fracture of the solder joints 2 in the related art printed circuit board assembly including the second printed circuit board 200 having the above-described thickness D, height H, and width W and including the above-described number of second electrodes 220, the minimum tensile strength was 16 N. In contrast, in the printed circuit board assembly 1 according to Embodiment 1, attachment of the support 130 to the second printed circuit board 200 allows the solder joints 2 to be less likely to fracture due to fatigue than are the solder joints in the related art. As long as the printed circuit board assembly 1 according to Embodiment 1 includes the second printed circuit board 200 having the above-described thickness D, height H, and width W and including the above-described number of second electrodes 220, the tensile strength of each solder joint 2 can therefore be less than 16 N.

Some related art printed circuit boards on which electronic components are mounted have resin coatings on their surfaces to reduce the likelihood of breakage or failure of the electronic components. As described above, the electronic components 210 on the printed circuit board assembly 1 according to Embodiment 1 are less likely to break or fail than are the electronic components in the related art. This effect eliminates the need for coating the second printed circuit board 200, on which the electronic components 210 are mounted, of the printed circuit board assembly 1 according to Embodiment 1 with resin.

As described above, the printed circuit board assembly 1 according to Embodiment 1 includes the first printed circuit board 100 and the second printed circuit board 200. The first printed circuit board 100 has the surface 101 and the surface 102 that is opposite the surface 101. The first printed circuit board 100 includes the slit portion 110 extending through the first printed circuit board 100 from the surface 101 to the surface 101. The second printed circuit board 200 has the surface 201 and the surface 202 that is opposite the surface 201, and includes the end portion 203 and the end portion 204 that is opposite the end portion 203. The end portion 203 of the second printed circuit board 200 is fitted in the slit portion 110 in such a manner that the tip of the end portion 203 protrudes from the surface 102. The first printed circuit board 100 includes the first electrodes 120 arranged along the slit portion 110 in the longitudinal direction of the slit portion 110 on at least one of the surface 101 and the surface 102. The second printed circuit board 200 includes the second electrodes 220 arranged in the end portion 203 on at least one of the surface 201 and the surface 202 and soldered to the first electrodes 120. The first printed circuit board 100 further includes the support 130 fixed to the surface 101. The second printed circuit board 200 is attached to the support 130 by the adhesive substance 131.

The support 130 in the printed circuit board assembly 1 according to Embodiment 1 is fixed to the surface 101 of the first printed circuit board 100. The second printed circuit board 200 is attached to the support 130 by the adhesive substance 131. This arrangement in the printed circuit board assembly 1 according to Embodiment 1 allows stress that is applied to the solder joints 2 between the first electrodes 120 of the first printed circuit board 100 and the second electrodes 220 of the second printed circuit board 200 to be smaller than stress in the related art. Thus, the likelihood of fatigue fracture of the solder joints 2 in the printed circuit board assembly 1 according to Embodiment 1 is lower than the likelihood of fatigue fracture of the solder joints in the related art.

In Embodiment 1, the configuration of part including the end portion 203 of the second printed circuit board 200 in the printed circuit board assembly 1 according to Embodiment 1 differs from the configuration of part including the end portion 203 of the second printed circuit board 200 in the related art printed circuit board assembly 500. However, the configuration of the part including the end portion 203 of the second printed circuit board 200 in the printed circuit board assembly 1 according to Embodiment 1 is not limited to the above-described configuration. For example, if the end portion 203 of the second printed circuit board 200 in the printed circuit board assembly 1 according to Embodiment 1 has the same configuration as the configuration in the related art printed circuit board assembly 500, the above-described advantageous effects can be obtained. It is preferred that the configuration of the part including the end portion 203 of the second printed circuit board 200 in the printed circuit board assembly 1 according to Embodiment 1 have a configuration as illustrated in FIG. 10 or FIG. 15, which will be described below.

Figure 15:
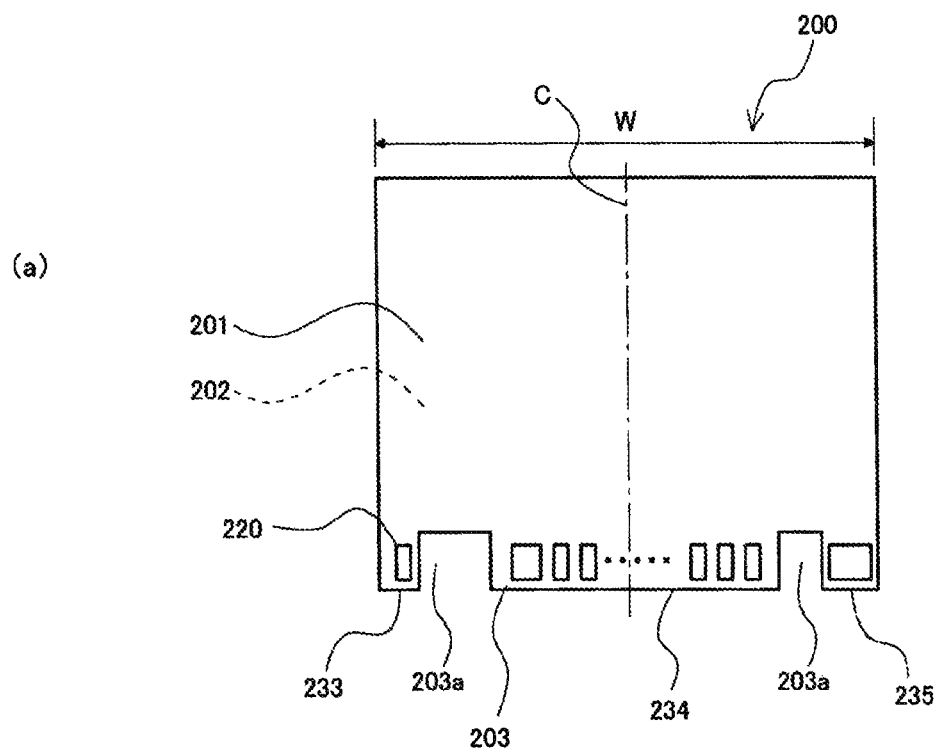
FIG. 15 includes diagrams each illustrating another exemplary second printed circuit board in the printed circuit board assembly according to Embodiment 1 of the present disclosure.
Figure 15:
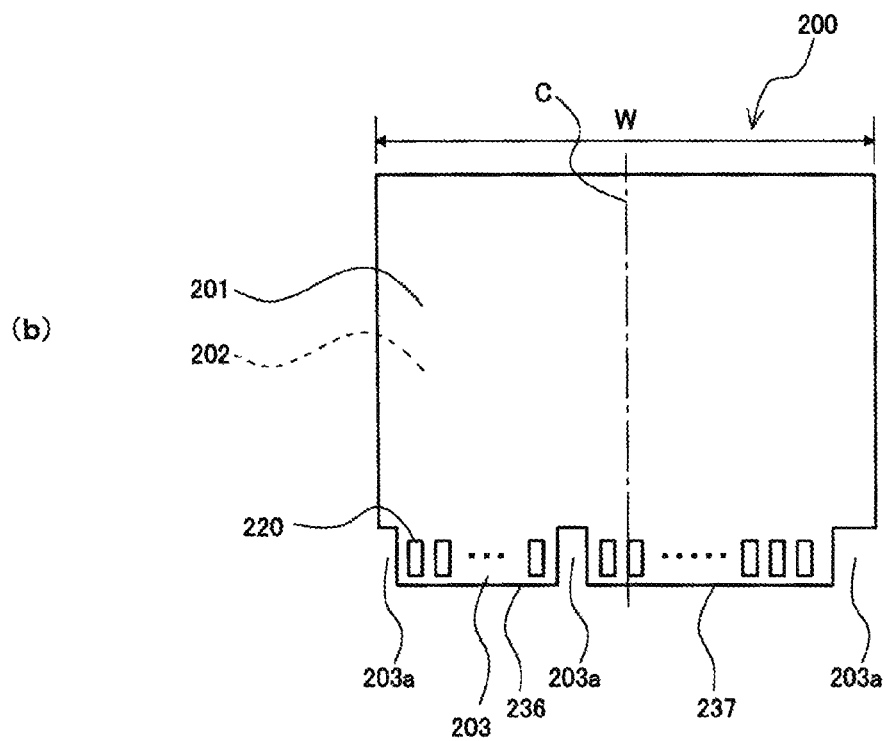

FIG. 15 includes diagrams each illustrating another exemplary second printed circuit board in the printed circuit board assembly according to Embodiment 1 of the present disclosure. FIG. 15(a) illustrates a second printed circuit board 200, which includes an end portion 203 having notches 203a at two positions other than opposite ends of the end portion 203 in the longitudinal direction of the slit portion 110. The end portion 203 of the second printed circuit board 200 of FIG. 15(a) has three protrusions. Specifically, the end portion 203 of the second printed circuit board 200 of FIG. 15(a) includes a protrusion 233, a protrusion 234, and a protrusion 235. FIG. 15(b) illustrates a second printed circuit board 200, which includes an end portion 203 having notches 203a at opposite ends of the end portion 203 in the longitudinal direction of the slit portion 110 and at a position other than the opposite ends of the end portion 203. The end portion 203 of the second printed circuit board 200 of FIG. 15(b) has two protrusions. Specifically, the end portion 203 of the second printed circuit board 200 of FIG. 15(b) includes a protrusion 236 and a protrusion 237.

As illustrated in FIGS. 10 and 15, a center line dividing the second printed circuit board 200 into two halves at the middle in the longitudinal direction of the slit portion 110 is referred to as a center line C. In other words, the center line C passes through the middle of the width W. In this case, the end portion 203 of each of the second printed circuit boards 200 illustrated in FIGS. 10 and 15 is asymmetric about the center line C. Such a shape of the second printed circuit board 200 prevents the end portion 203 of the second printed circuit board 200 from being incorrectly inserted into the slit portion 110 of the first printed circuit board 100.

Embodiment 2

An exemplary preferred mounting mechanism for mounting the printed circuit board assembly 1 to the mounting component 300 of the apparatus will be described in Embodiment 2. Note that items that are not particularly mentioned in Embodiment 2 are the same as the items in Embodiment 1 and the same functions and components as the functions and the components in Embodiment 1 are designated by the same reference signs in the following description.

Figure 16:
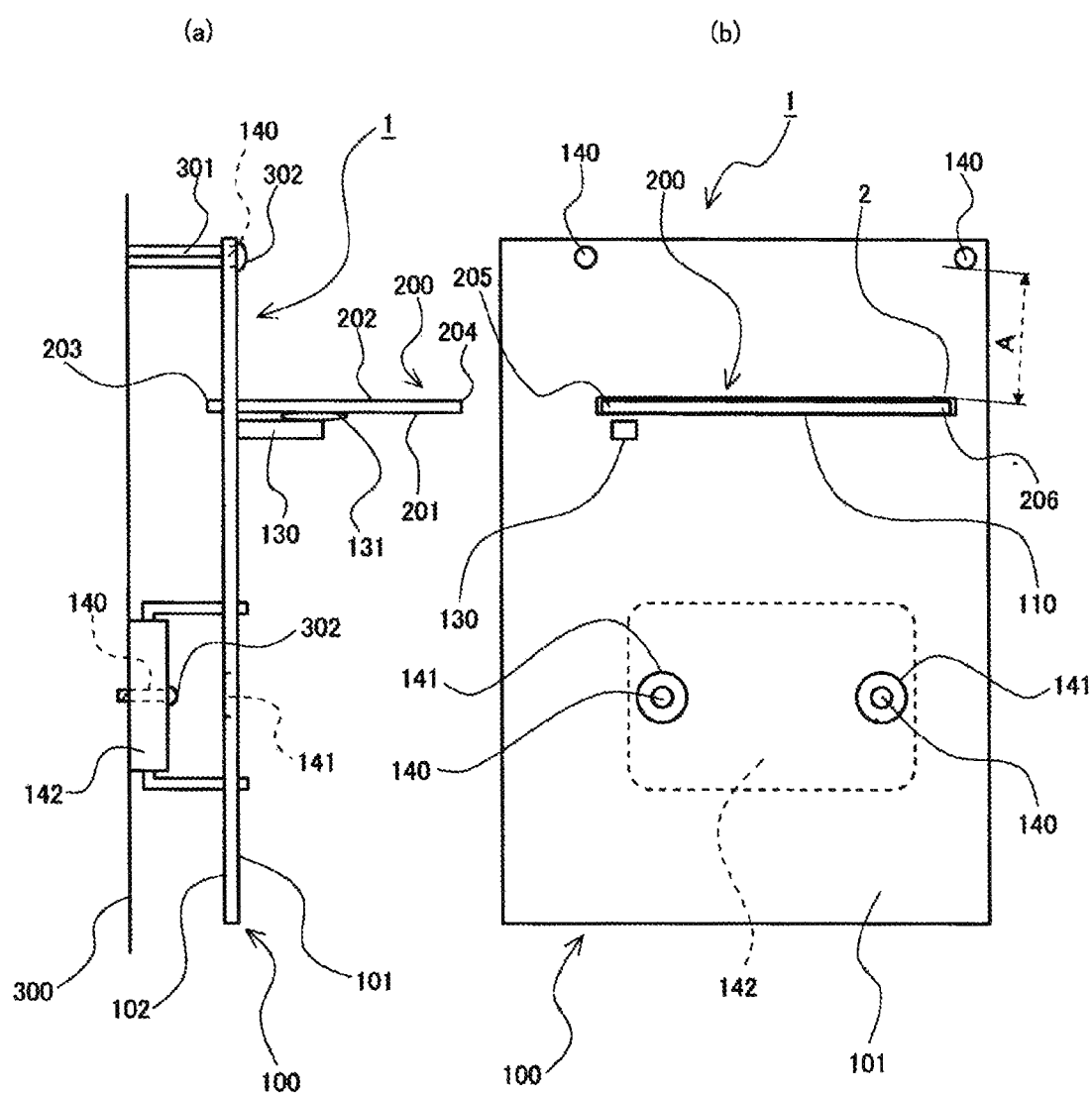
FIG. 16 includes diagrams explaining a printed circuit board assembly according to Embodiment 2 of the present disclosure mounted on a mounting component of an apparatus.

FIG. 16 includes diagrams explaining a printed circuit board assembly according to Embodiment 2 of the present disclosure mounted on a mounting component of an apparatus. FIG. 16(a) illustrates the printed circuit board assembly 1 according to Embodiment 2 mounted on the mounting component 300 of the apparatus. FIG. 16(b) illustrates the printed circuit board assembly 1 according to Embodiment 2 as viewed from a front of the surface 101 of the first printed circuit board 100 in the direction perpendicular to the surface 101. In other words, as can be seen from FIG. 16, FIG. 16(b) illustrates the printed circuit board assembly 1 as viewed from the right of FIG. 16(a).

The printed circuit board assembly 1 is incorporated as part of, for example, a controller, in the apparatus. In this case, the printed circuit board assembly 1 is secured to the mounting component 300 included in the apparatus. As described above, examples of the apparatus include an air-conditioning apparatus and a refrigeration apparatus. As described above, the mounting component 300 is, for example, a control box made of a metal sheet.

Specifically, the printed circuit board assembly 1 has the multiple through-holes 140. The printed circuit board assembly 1 is secured to the mounting component 300 by using the through-holes 140. At least one of the through-holes 140 is located in, for example, the first printed circuit board 100. At least one of the through-holes 140 is located in, for example, a circuit part 142 disposed on the first printed circuit board 100.

The circuit part 142 is, for example, a power module. The printed circuit board assembly 1 according to Embodiment 2 has four through-holes 140. Two of the four through-holes 140 are arranged in the first printed circuit board 100. The other two of the four through-holes 140 are arranged in the circuit part 142 mounted on the first printed circuit board 100.

For the through-holes 140 arranged in the first printed circuit board 100, for example, the printed circuit board assembly 1 is secured to the mounting component 300 by using the through-holes in the following manner. The mounting component 300 includes the spacers 301 made of resin or metal. These spacers 301 each have a female thread. A male-threaded screw 302 is inserted into each through-hole 140 of the first printed circuit board 100 and is then fitted into the female thread of the corresponding one of the spacers 301, so that the printed circuit board assembly 1 is secured to the mounting component 300. For the circuit part 142, for example, the printed circuit board assembly 1 is secured to the mounting component 300 by using the circuit part in the following manner. The mounting component 300 has female threads. A male-threaded screw 302 is inserted into each of the through-holes 140 of the circuit part 142 and is then fitted into the corresponding one of the female threads of the mounting component 300, so that the printed circuit board assembly 1 is secured to the mounting component 300. The first printed circuit board 100 according to Embodiment 2 has through-holes 141 located to face the through-holes 140 of the circuit part 142 so that the male-threaded screws 302 can be easily inserted into the through-holes 140.

The through-holes 140 correspond to mounting parts in the present disclosure.

As described above, when the mounting component 300 resonates, vibration of the mounting component 300 is transmitted to the printed circuit board assembly 1 mounted on the mounting component 300. At this time, the vibration of the mounting component 300 is transmitted from the positions of the through-holes 140, which are the mounting parts, to the first printed circuit board 100. Then, vibration of the first printed circuit board 100 is transmitted to the second printed circuit board 200 through the solder joints 2. The distance between each of the solder joints 2 and the through-hole 140 closest to the solder joint 2 in the printed circuit board assembly 1 as viewed in the direction perpendicular to the surface 101 of the first printed circuit board 100 is referred to as a distance A. The longer the distance A, the larger the magnitude of vibration and the amount of bending of part of the first printed circuit board 100 that is located between the solder joint 2 and the through-hole 140 closest to the solder joint 2. In other words, as the distance A increases, a load applied to the solder joint 2 increases, and thus stress generated in the solder joint 2 increases.

In the printed circuit board assembly 1 according to Embodiment 2, the positional relationship between the solder joints 2 and the through-holes 140 is defined as follows. Specifically, actual measurement of multiple related art printed circuit board assemblies manufactured by the applicant revealed that as long as the distance A is 50 mm or less, stress leading to fatigue fracture is not generated in the solder joint 2. For this reason, in the printed circuit board assembly 1 according to Embodiment 2, at least one of the solder joints 2 is located in such a manner that the distance A is 50 mm or less. In other words, the distance between one of the through-holes 140 and at least one of the solder joints 2 in the printed circuit board assembly 1 as viewed in the direction perpendicular to the surface 101 of the first printed circuit board 100 is 50 mm or less.

The positional relationship between the solder joints 2 and the through-holes 140 defined in Embodiment 2 further reduces the likelihood of fatigue fracture of the solder joints 2.

The mounting parts in the present disclosure are not limited to the through-holes 140. For example, the first printed circuit board 100 may include studs, which are mounting parts. Each stud is a columnar component having a male thread in its head. The male thread of each stud may be inserted into the through-hole of the mounting component 300, and a nut may be screwed onto the male thread to sandwich the mounting component 300 between the nut and columnar part of the stud, to secure the printed circuit board assembly 1 to the mounting component 300.

Embodiment 3

The placement position of the support 130 is not limited to the position illustrated in Embodiment 1. An exemplary preferred placement position of the support 130 will be described in Embodiment 3. Note that items that are not particularly mentioned in Embodiment 3 are the same as the items in Embodiment 1 or Embodiment 2 and the same functions and components as the functions and the components in Embodiment 1 or Embodiment 2 are designated by the same reference signs in the following description.

Figure 17:
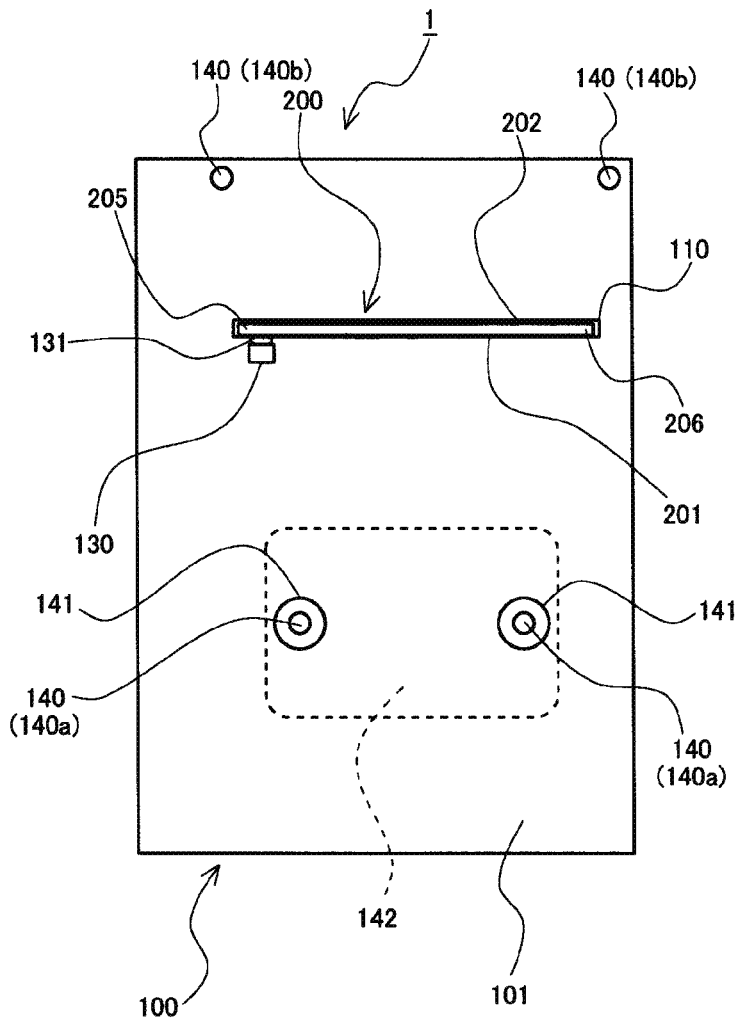
FIG. 17 is a diagram illustrating a printed circuit board assembly according to Embodiment 3 of the present disclosure.
Figure 18:
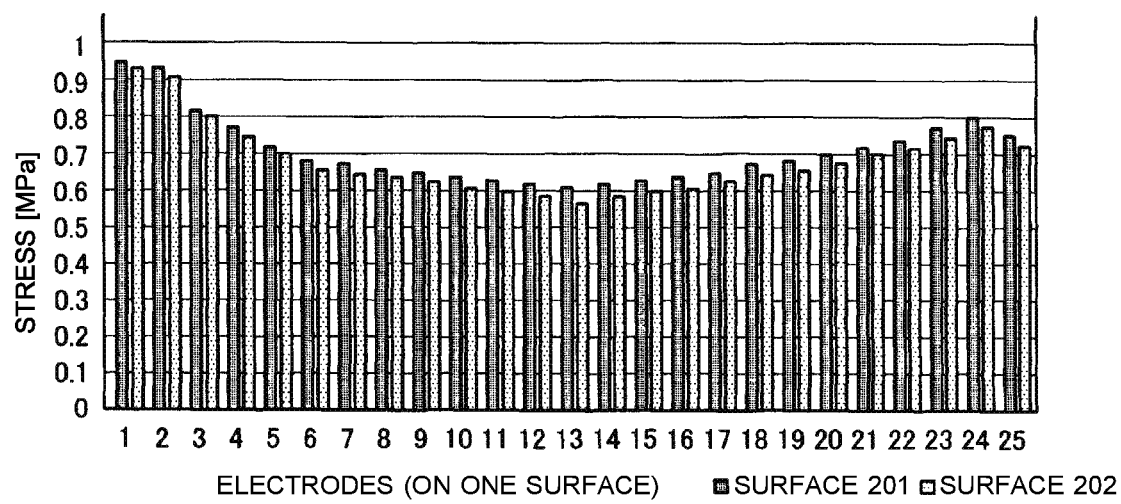
FIG. 18 is a graph illustrating stresses generated in solder joints during vibration in a printed circuit board assembly obtained by removing a support from the printed circuit board assembly according to Embodiment 3 of the present disclosure.

FIG. 17 is a diagram illustrating a printed circuit board assembly according to Embodiment 3 of the present disclosure. FIG. 17 illustrates the printed circuit board assembly 1 as viewed in the direction perpendicular to the surface 101 of the first printed circuit board 100. FIG. 18 is a graph illustrating stresses generated in solder joints during vibration in a printed circuit board assembly obtained by removing the support from the printed circuit board assembly according to Embodiment 3 of the present disclosure. In FIG. 18, the horizontal axis represents the second electrodes 220 in FIG. 10. In other words, the horizontal axis of FIG. 18 represents the solder joints 2 joining the second electrodes 220 to the first electrodes 120. For example, a numeral "1" on the horizontal axis of FIG. 18 represents the solder joint 2 joining the second electrode 220 at the position "1" in FIG. 10. In FIG. 18, the vertical axis represents the stresses generated in the solder joints 2 during vibration of the second printed circuit board 200. The values of stresses illustrated in FIG. 18 are merely examples.

Of the multiple through-holes 140, as illustrated in FIG. 17, the through-holes 140 adjacent to the surface 201 and remote from the surface 202 are defined as first through-holes 140a. Furthermore, of the multiple through-holes 140, the through-holes 140 adjacent to the surface 202 and remote from the surface 201 are defined as second through-holes 140b. In such a case, the distance between the second printed circuit board 200 and the first through-hole 140a closest to the second printed circuit board 200 of the first through-holes 140a is longer than the distance between the second printed circuit board 200 and the second through-hole 140b closest to the second printed circuit board 200 of the second through-holes 140b. In this arrangement, stresses generated in the solder joints 2 joining the second electrodes 220 of the second printed circuit board 200 in the printed circuit board assembly, obtained by removing the support 130 from the printed circuit board assembly 1 according to Embodiment 3, are as illustrated in FIG. 18. Specifically, stresses generated in the solder joints 2 joining the second electrodes 220 on the surface 201 of the second printed circuit board 200 are larger than stresses generated in the solder joints 2 joining the second electrodes 220 on the surface 202 of the second printed circuit board 200.

The first through-hole 140a corresponds to a first mounting part in the present disclosure. The second through-hole 140b corresponds to a second mounting part in the present disclosure.

In the printed circuit board assembly 1 according to Embodiment 3, the surface 201 having the solder joints 2 that are likely to experience large stress is therefore attached to the support 130 with the adhesive substance 131. Such a configuration of the printed circuit board assembly 1 can alleviate stress that is generated in the solder joints 2 on the surface 201. The placement of the support 130 in the printed circuit board assembly 1 according to Embodiment 3 therefore further reduces the likelihood of fatigue fracture of the solder joints 2.

Embodiment 4

The placement position of the support 130 is not limited to any of the positions illustrated in Embodiments described above. An exemplary preferred placement position of the support 130 will be described in Embodiment 4. Note that items that are not particularly mentioned in Embodiment 4 are the same as the items in any of Embodiments 1 to 3 and the same functions and components as the functions and the components in any of Embodiments 1 to 3 are designated by the same reference signs in the following description.

Figure 19:
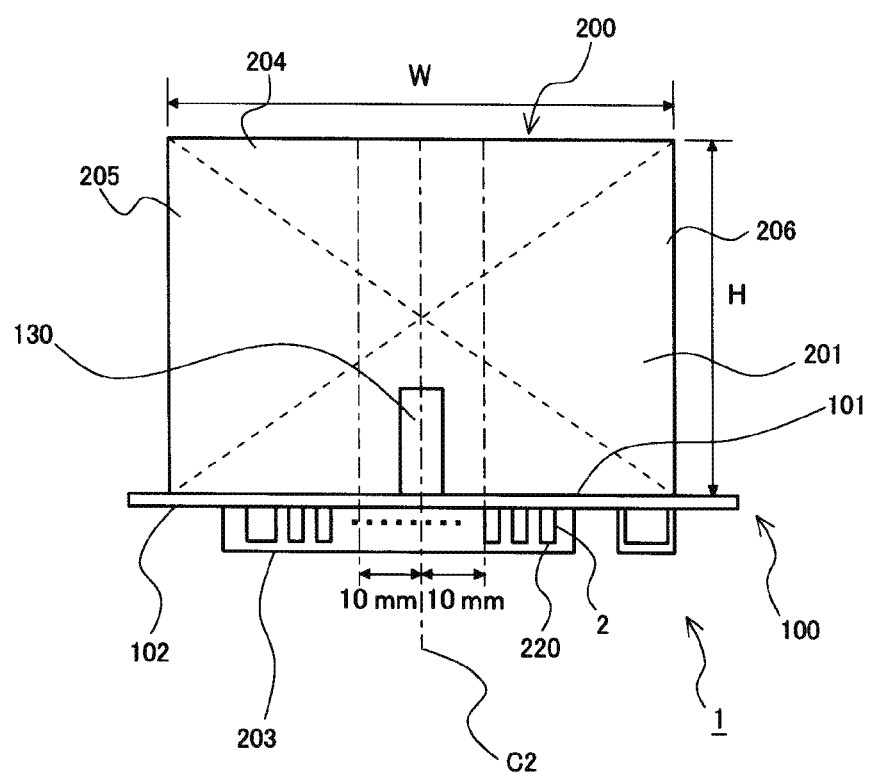
FIG. 19 is a diagram illustrating a printed circuit board assembly according to Embodiment 4 of the present disclosure.

FIG. 19 is a diagram illustrating a printed circuit board assembly according to Embodiment 4 of the present disclosure. FIG. 19 illustrates the printed circuit board assembly 1 as viewed in the direction perpendicular to the surface 201 of the second printed circuit board 200. In FIG. 19, an alternate long and short dashed line designated by reference sign "C2" passes through the center of gravity of the second printed circuit board 200 and is orthogonal to the longitudinal direction of the slit portion 110, or the direction along the width W.

In the printed circuit board assembly 1 according to Embodiment 4, the support 130 is attached to the second printed circuit board 200 within a distance of 10 mm from the center of gravity of the second printed circuit board 200 in the longitudinal direction of the slit portion 110.

In the second printed circuit board 200 attached to the support 130, stress generated in a solder joint 2 by vibration of the second printed circuit board 200 is larger as the solder joint 2 is located farther from the position of attachment between the support 130 and the second printed circuit board 200. For this reason, attaching the support 130 to the second printed circuit board 200 in the above-described manner in Embodiment 4 reduces the distance between the position of attachment between the support 130 and the second printed circuit board 200 and each of the end portion 205 and the end portion 206. In other words, this arrangement reduces or eliminates an excessive increase in stress in the solder joints 2 in the vicinity of each of the end portion 205 and the end portion 206, and thus reduces variations in stress between the solder joints 2. Such a configuration of the printed circuit board assembly 1 according to Embodiment 4 enables the entire printed circuit board assembly 1 to have higher resistance to stress, and thus further reduces the likelihood of fatigue fracture of the solder joints 2.

Embodiment 5

The placement position of the support 130 is not limited to any of the positions illustrated in Embodiments described above. An exemplary preferred placement position of the support 130 will be described in Embodiment 5. Note that items that are not particularly mentioned in Embodiment 5 are the same as the items in any of Embodiments 1 to 4 and the same functions and components as the functions and the components in any of Embodiments 1 to 4 are designated by the same reference signs in the following description.

Figure 20:
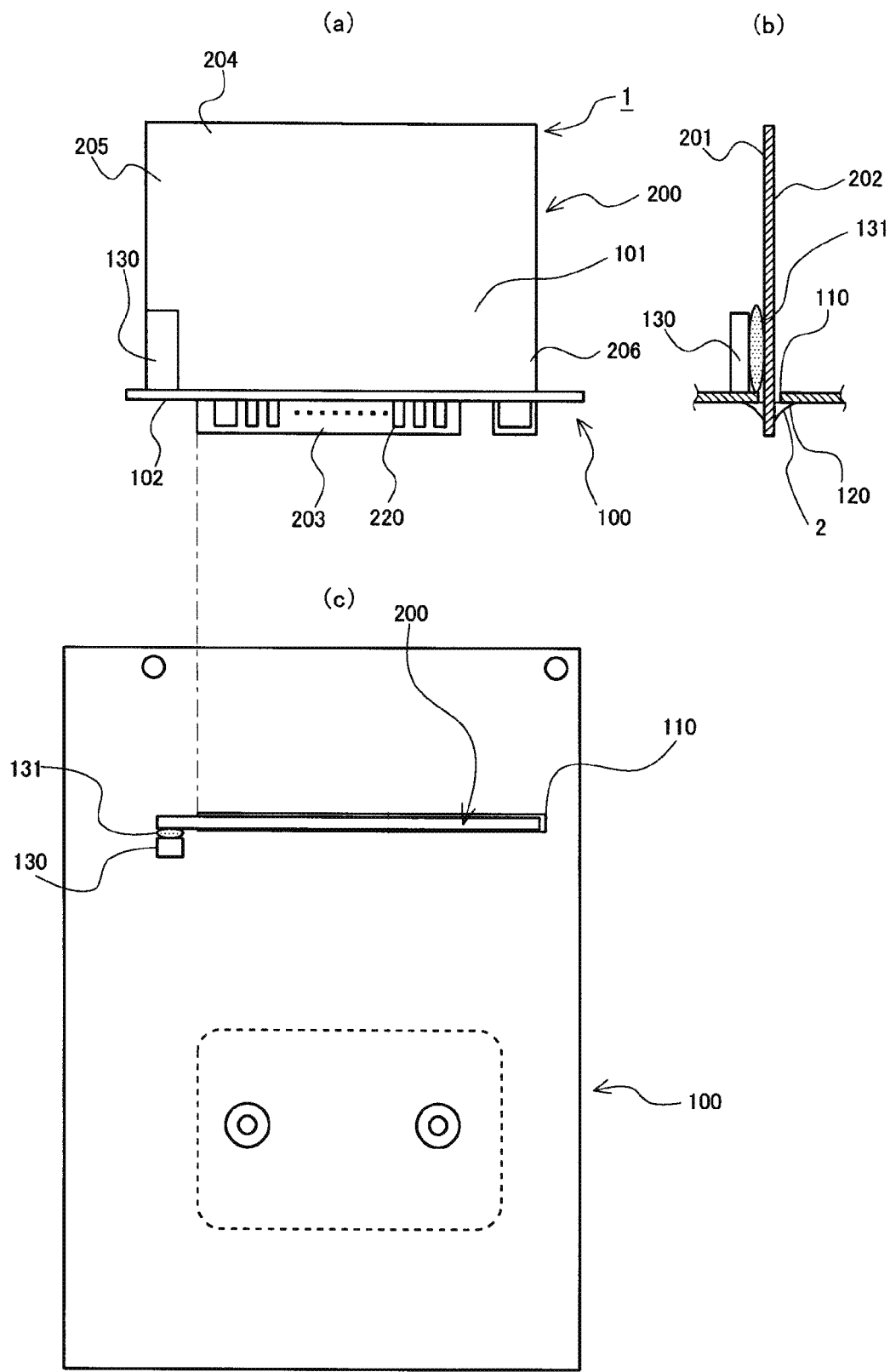
FIG. 20 includes diagrams illustrating a printed circuit board assembly according to Embodiment 5 of the present disclosure.

FIG. 20 includes diagrams illustrating a printed circuit board assembly according to Embodiment 5 of the present disclosure. FIG. 20(a) illustrates the printed circuit board assembly 1 as viewed in the direction perpendicular to the surface 201 of the second printed circuit board 200. FIG. 20(b) illustrates a cross-section of the printed circuit board assembly 1 taken in the direction orthogonal to the longitudinal direction of the slit portion 110 in the first printed circuit board 100. FIG. 20(c) illustrates the printed circuit board assembly 1 as viewed in the direction perpendicular to the surface 101 of the first printed circuit board 100. In other words, FIG. 20(c) is a plan view of the printed circuit board assembly 1 of FIG. 20(a).

In the printed circuit board assembly 1 according to Embodiment 5, the support 130 is attached to part of the second printed circuit board 200 that is not located within the slit portion 110 in the longitudinal direction of the slit portion 110. In other words, the support 130 is positioned not to face a long side of the slit portion 110.

In the use of the printed circuit board assembly 1 incorporated in the apparatus, a heat cycle, in which heating and cooling are repeated, occurs in the printed circuit board assembly 1. During heating in the heat cycle, the second electrodes 220 of the second printed circuit board 200 tend to expand due to thermal expansion of the second printed circuit board 200. Furthermore, the first electrodes 120 of the first printed circuit board 100 also tend to expand due to thermal expansion of the first printed circuit board 100 during heating in the heat cycle. In this case, if the support 130 is not attached to the second printed circuit board 200, the first electrodes 120 and the second electrodes 220 can expand during heating in the heat cycle. Consequently, among the solder joints 2 joining the first electrodes 120 and the second electrodes 220, there is no solder joint 2 that experiences excessively large stress.

The second electrodes 220 are located in part of the end portion 203 of the second printed circuit board 200 that is fitted in the slit portion 110 in the longitudinal direction of the slit portion 110. The difference in linear expansion coefficient between the support 130 and each of the first printed circuit board 100 and the second printed circuit board 200 is greater than the difference in linear expansion coefficient between the first printed circuit board 100 and the second printed circuit board 200. If the support 130 is attached to part of the second printed circuit board 200 that is located within the slit portion 110 in the longitudinal direction of the slit portion 110, excessively large stress may be generated in any of the solder joints 2. Specifically, as the position of attachment between the support 130 and the second printed circuit board 200 is the position of support, the degree of misalignment between each of the first electrodes 120 and the corresponding one of the second electrodes 220 may increase during heating in the heat cycle as the positions of the first and second electrodes are farther from the position of attachment, and thus stress in the corresponding one of the solder joints 2 may increase.

In the printed circuit board assembly 1 according to Embodiment 5, the part of the second printed circuit board 200 that is not located within the slit portion 110 in the longitudinal direction of the slit portion 110 is attached to the support 130. In other words, the support 130 is attached to part of the second printed circuit board 200 that is located out of an area in which the first electrodes 120 and the second electrodes 220 are arranged in the longitudinal direction of the slit portion 110. This attachment between the support 130 and the second printed circuit board 200 allows the first electrodes 120 and the second electrodes 220 to expand during heating in the heat cycle in a manner similar to the manner in the case where the support 130 is not attached to the second printed circuit board 200. Such a configuration of the printed circuit board assembly 1 according to Embodiment 5 therefore further reduces the likelihood of fatigue fracture of the solder joints 2.

REFERENCE SIGNS LIST 1 printed circuit board assembly 2 solder joint 100 first printed circuit board 101 surface 102 surface 110 slit portion 111 to 113 slit 120 first electrode 130 support 131 adhesive substance 140 through-hole 140a first through-hole 140b second through-hole 141 through-hole 142 circuit part 200 second printed circuit board 201 surface 202 surface 203 end portion 203a notch 203b end face 204 end portion 205 end portion 206 end portion 210 electronic component 220 second electrode 230 to 237 protrusion 300 mounting component 301 spacer 302 male-threaded screw 500 printed circuit board assembly (related art)

The invention claimed is:

1. A printed circuit board assembly comprising:
a first printed circuit board having a first surface and a second surface that is opposite the first surface and including a slit portion extending through the first printed circuit board from the first surface to the second surface; and
a second printed circuit board having a third surface and a fourth surface that is opposite the third surface and including a first end portion and a second end portion that is opposite the first end portion, the first end portion being fitted in the slit portion in such a manner that a tip of the first end portion protrudes from the second surface,
the first printed circuit board including a plurality of first electrodes arranged along the slit portion in a longitudinal direction of the slit portion on at least one of the first surface and the second surface,
the second printed circuit board including a plurality of second electrodes arranged in the first end portion on at least one of the third surface and the fourth surface, the plurality of second electrodes being joined to the plurality of first electrodes with a solder,
the first printed circuit board further including a support fixed to the first surface,
the second printed circuit board being attached to the support by an adhesive substance,
the printed circuit board assembly further comprising a plurality of mounting parts used to mount the printed circuit board assembly to a mounting component,
when the printed circuit board assembly is viewed in a direction perpendicular to the first surface,
of the plurality of mounting parts, at least one mounting part adjacent to the third surface and remote from the fourth surface is defined as at least one first mounting part and,
of the plurality of mounting parts, at least one mounting part adjacent to the fourth surface and remote from the third surface is defined as at least one second mounting part, a distance between the second printed circuit board and a first mounting part closest to the second printed circuit board of the at least one first mounting part being longer than a distance between the second printed circuit board and a second mounting part closest to the second printed circuit board of the at least one second mounting part, the third surface of the second printed circuit board being attached to the support by the adhesive substance, when the printed circuit board assembly is viewed from a front of the first surface in the direction perpendicular to the first surface, the support is disposed on the first surface on a one single side extending along the longitudinal direction of the slit portion so as to face the third surface of the second printed circuit board, wherein the second printed circuit board includes a third end portion and a fourth end portion arranged in the longitudinal direction of the slit portion, wherein, of the plurality of second electrodes, a second electrode closest to the third end portion has a smaller amount of the solder than does a second electrode closest to the fourth end portion, and wherein the third end portion of the second printed circuit board is attached to the support.

2. The printed circuit board assembly of claim 1, wherein, in a case where a distance from the first surface of the first printed circuit board to a tip of the second end portion of the second printed circuit board is defined as a height H, a part of the second printed circuit board that corresponds to a distance of 0.1×H or more from the first surface toward the second end portion is attached to the support.

3. The printed circuit board assembly of claim 2, wherein the part of the second printed circuit board that corresponds to a distance of ((H/2)+10 mm) or less from the first surface is attached to the support.

4. The printed circuit board assembly of claim 1, further comprising wherein at least one of solder joints joining the plurality of first electrodes and the plurality of second electrodes is located at a distance of 50 mm or less from one of the plurality of mounting parts when the printed circuit board assembly is viewed in the direction perpendicular to the first surface.

5. The printed circuit board assembly of claim 1, wherein the first end portion has at least one cut and includes a plurality of protrusions, wherein the slit portion includes a plurality of slits in which the plurality of protrusions are fitted, and wherein a center line dividing the second printed circuit board into two halves at a middle in the longitudinal direction of the slit portion is referred to as a center line C, and the first end portion of the second printed circuit board is asymmetric about the center line C.

6. The printed circuit board assembly of claim 1, wherein the plurality of first electrodes and the plurality of second electrodes are joined by wave soldering performed while the first printed circuit board and the second printed circuit board are being conveyed in a conveying direction that is along the longitudinal direction of the slit portion, wherein the second printed circuit board includes the third end portion that is a leading end in the conveying direction during wave soldering, and wherein the third end portion of the second printed circuit board is attached to the support.

7. The printed circuit board assembly of claim 1, wherein a part of the second printed circuit board that is not located within the slit portion in the longitudinal direction of the slit portion is attached to the support.

8. The printed circuit board assembly of claim 1, wherein the support is attached to the second printed circuit board within a distance of 10 mm from a center of gravity of the second printed circuit board in the longitudinal direction of the slit portion.

9. The printed circuit board assembly of claim 1, further comprising a circuit part disposed on the second surface of the first printed circuit board, wherein the circuit part includes at least one of the plurality of mounting parts.

10. The printed circuit board assembly of claim 1, wherein the support is a connector, a heat sink, or an electrolytic capacitor.

11. The printed circuit board assembly of claim 1, wherein the second printed circuit board has a thickness corresponding to a distance between the third surface and the fourth surface and the thickness is 1.4 mm or more and 1.8 mm or less, wherein a height H that is a distance from the first surface of the first printed circuit board to a tip of the second end portion of the second printed circuit board is 25 mm or more and 60 mm or less, wherein a width W that is a dimension of the second printed circuit board in the longitudinal direction of the slit portion is one to two times as long as the height H, wherein the plurality of first electrodes arranged on one side of the slit portion along the slit portion in the longitudinal direction of the slit portion range in number up to 25, and wherein the solder with which each of the plurality of first electrodes is joined to a corresponding one of the plurality of second electrodes has a tensile strength of 16 or less and the tensile strength is a tensile load that the solder withstands without fracturing.

12. The printed circuit board assembly of claim 1, wherein the second printed circuit board includes an electronic component on at least one surface of the third surface and the fourth surface, and wherein the second printed circuit board has no resin coating on the at least one surface.

\* \* \* \* \*